(12) United States Patent
Yamazaki et al.

(10) Patent No.: US 7,675,074 B2
(45) Date of Patent: Mar. 9, 2010

(54) LIGHT EMITTING DEVICE INCLUDING A LAMINATION LAYER

(75) Inventors: Shunpei Yamazaki, Tokyo (JP); Yasuyuki Arai, Kanagawa (JP)

(73) Assignee: Semiconductor Energy Laboratory Co., Ltd., Atsugi-shi, Kanagawa-Ken (JP)

( * ) Notice: Subject to any disclaimer, the term of this patent is extended or adjusted under 35 U.S.C. 154(b) by 0 days.

(21) Appl. No.: 11/652,486

(22) Filed: Jan. 12, 2007

(65) Prior Publication Data

US 2007/0114542 A1 May 24, 2007

Related U.S. Application Data

(62) Division of application No. 10/426,971, filed on May 1, 2003, now Pat. No. 7,164,155.

(30) Foreign Application Priority Data

May 15, 2002 (JP) .............................. 2002-140033

(51) Int. Cl.
*H01L 29/161* (2006.01)

(52) U.S. Cl. .................. 257/84; 257/40; 257/E51.001; 257/E33.001

(58) Field of Classification Search .................. 257/40, 257/84
See application file for complete search history.

(56) References Cited

U.S. PATENT DOCUMENTS 4,489,481 A 12/1984 Jones (Continued)

FOREIGN PATENT DOCUMENTS

EP 0 767 599 A2 4/1997

(Continued)

OTHER PUBLICATIONS

Tetsuo Tsutsui et al., "Electroluminescence in Organic Thin Films"; Photochemical Processes in Organized Molecular Systems; Sep. 22, 1990; pp. 437-450.

(Continued)

*Primary Examiner*—Kenneth A Parker
*Assistant Examiner*—Anthony Ho
(74) *Attorney, Agent, or Firm*—Nixon Peabody, LLP; Jeffrey L. Costellia

(57) ABSTRACT

A light emitting device having a plastic substrate is capable of preventing the substrate from deterioration with the transmission of oxygen or moisture content can be obtained. The light emitting device has light emitting elements formed between a lamination layer and an inorganic compound layer that transmits visual light, where the lamination layer is constructed of one unit or two or more units, and each unit is a laminated structure of a metal layer and an organic compound layer. Alternatively, the light emitting device has light emitting elements formed between a lamination layer and an inorganic compound layer that transmits visual light, where the lamination layer is constructed of one unit or two or more units, and each unit is a laminated structure of a metal layer and an organic compound layer, wherein the inorganic compound layer is formed so as to cover the end face of the lamination layer. In the present invention, the lamination layer is formed on the primary surface of the plastic substrate, so that a flexible substrate structure can be obtained while preventing the substrate from deterioration with the transmission of oxygen or moisture content.

18 Claims, 15 Drawing Sheets

U.S. PATENT DOCUMENTS

| | | |
|---|---|---|
| 5,049,780 A | 9/1991 | Dobrowolski et al. |
| 5,107,175 A | 4/1992 | Hirano et al. |
| 5,124,204 A | 6/1992 | Yamashita et al. |
| 5,182,620 A | 1/1993 | Shimada et al. |
| 5,189,405 A | 2/1993 | Yamashita et al. |
| 5,455,625 A | 10/1995 | Englander |
| 5,583,369 A | 12/1996 | Yamazaki et al. |
| 5,627,364 A | 5/1997 | Codama et al. |
| 5,674,304 A | 10/1997 | Fukada et al. |
| 5,681,759 A | 10/1997 | Zhang |
| 5,686,360 A | 11/1997 | Harvey, III et al. |
| 5,693,956 A | 12/1997 | Shi et al. |
| 5,696,386 A | 12/1997 | Yamazaki |
| 5,757,126 A | 5/1998 | Harvey, III et al. |
| 5,771,562 A | 6/1998 | Harvey, III et al. |
| 5,811,177 A | 9/1998 | Shi et al. |
| 5,821,138 A | 10/1998 | Yamazaki et al. |
| 5,946,561 A | 8/1999 | Yamazaki et al. |
| 5,952,778 A | 9/1999 | Haskal et al. |
| 5,962,970 A | 10/1999 | Yokoi et al. |
| 5,973,449 A | 10/1999 | Nakamura et al. |
| 6,087,196 A | 7/2000 | Sturm et al. |
| 6,091,195 A | 7/2000 | Forrest et al. |
| 6,127,199 A | 10/2000 | Inoue et al. |
| 6,144,108 A | 11/2000 | Ohizumi et al. |
| 6,146,225 A | 11/2000 | Sheats et al. |
| 6,150,187 A | 11/2000 | Zyung et al. |
| 6,198,217 B1 | 3/2001 | Suzuki et al. |
| 6,198,220 B1 | 3/2001 | Jones et al. |
| 6,268,631 B1 | 7/2001 | Fukada et al. |
| 6,268,695 B1 | 7/2001 | Affinito |
| 6,287,955 B1 | 9/2001 | Wang et al. |
| 6,329,087 B1 | 12/2001 | Okamoto |
| 6,372,608 B1 | 4/2002 | Shimoda et al. |
| 6,376,105 B1 | 4/2002 | Jonas et al. |
| 6,376,333 B1 | 4/2002 | Yamazaki et al. |
| 6,380,687 B1 | 4/2002 | Yamazaki |
| 6,413,645 B1 | 7/2002 | Graff et al. |
| 6,433,487 B1 | 8/2002 | Yamazaki |
| 6,462,469 B1 | 10/2002 | Young |
| 6,475,845 B2 | 11/2002 | Kimura |
| 6,497,598 B2 | 12/2002 | Affinito |
| 6,522,067 B1 | 2/2003 | Graff et al. |
| 6,538,390 B2 | 3/2003 | Fujita et al. |
| 6,541,294 B1 | 4/2003 | Yamazaki et al. |
| 6,548,912 B1 | 4/2003 | Graff et al. |
| 6,570,325 B2 | 5/2003 | Graff et al. |
| 6,573,652 B1 | 6/2003 | Graff et al. |
| 6,586,772 B2 | 7/2003 | Bijlsma |
| 6,623,861 B2 | 9/2003 | Martin et al. |
| 6,638,645 B2 | 10/2003 | Sawai et al. |
| 6,639,360 B2 | 10/2003 | Roberts et al. |
| 6,720,203 B2 | 4/2004 | Carcia et al. |
| 6,771,677 B2 | 8/2004 | Furukawa et al. |
| 6,791,261 B1 | 9/2004 | Shimoda et al. |
| 6,798,132 B2 | 9/2004 | Satake |
| 6,866,901 B2 | 3/2005 | Burrows et al. |
| 6,881,501 B2 | 4/2005 | Yudasaka |
| 6,923,702 B2 | 8/2005 | Graff et al. |
| 6,956,324 B2 | 10/2005 | Yamazaki et al. |
| 6,962,671 B2 | 11/2005 | Martin et al. |
| 7,164,155 B2 * | 1/2007 | Yamazaki et al. ............ 257/84 |
| 7,198,832 B2 | 4/2007 | Burrows et al. |
| RE40,531 E | 10/2008 | Graff et al. |
| 2001/0001485 A1 | 5/2001 | Bao et al. |
| 2001/0011726 A1 | 8/2001 | Hayashi et al. |
| 2001/0011868 A1 | 8/2001 | Fukunaga et al. |
| 2001/0026835 A1 | 10/2001 | Tanaka |
| 2001/0030323 A1 | 10/2001 | Ikeda |
| 2001/0040645 A1 | 11/2001 | Yamazaki |
| 2001/0054867 A1 | 12/2001 | Kubota |
| 2002/0017643 A1 | 2/2002 | Koyama |
| 2002/0043932 A1 | 4/2002 | Kawashima |
| 2002/0047120 A1 | 4/2002 | Inukai |
| 2002/0063515 A1 | 5/2002 | Goto |
| 2002/0125817 A1 | 9/2002 | Yamazaki et al. |
| 2003/0027369 A1 | 2/2003 | Yamazaki |
| 2003/0034497 A1 | 2/2003 | Yamazaki et al. |
| 2003/0057422 A1 | 3/2003 | Yamazaki et al. |
| 2003/0155573 A1 | 8/2003 | Yamazaki et al. |
| 2003/0201447 A1 | 10/2003 | Yamazaki et al. |
| 2003/0201716 A1 | 10/2003 | Yamazaki et al. |
| 2003/0206332 A1 | 11/2003 | Yamazaki et al. |
| 2003/0227021 A1 | 12/2003 | Yamazaki et al. |
| 2005/0012248 A1 | 1/2005 | Yi et al. |
| 2005/0073243 A1 | 4/2005 | Yamazaki et al. |
| 2005/0122039 A1 | 6/2005 | Satani |
| 2005/0176181 A1 | 8/2005 | Burrows et al. |
| 2006/0014465 A1 | 1/2006 | Yamazaki |
| 2007/0164376 A1 | 7/2007 | Burrows et al. |
| 2007/0196682 A1 | 8/2007 | Visser et al. |
| 2007/0210459 A1 | 9/2007 | Burrows et al. |

FOREIGN PATENT DOCUMENTS

| | | |
|---|---|---|
| EP | 1 524 708 A2 | 4/2005 |
| JP | 03-108531 A | 5/1991 |
| JP | 05-315630 | 11/1993 |
| JP | 08-068990 | 3/1996 |
| JP | 08-167475 | 6/1996 |
| JP | 08-288522 | 11/1996 |
| JP | 09-102393 | 4/1997 |
| JP | 10-125929 | 5/1998 |
| JP | 10-125931 | 5/1998 |
| JP | 10-158641 | 6/1998 |
| JP | 10-275680 | 10/1998 |
| JP | 10-289784 | 10/1998 |
| JP | 2000-173027 | 6/2000 |
| JP | 2001-118674 | 4/2001 |
| JP | 2001-272923 | 10/2001 |
| JP | 2002 050469 | 2/2002 |
| JP | 2002-082633 | 3/2002 |
| JP | 2002 117971 | 4/2002 |
| JP | 2003-17273 | 1/2003 |
| JP | 2003-272827 A | 9/2003 |
| JP | 2005-510757 A | 4/2005 |
| WO | WO 00/36665 | 6/2000 |
| WO | WO 00/76010 A1 | 12/2000 |
| WO | WO 01/81649 A1 | 11/2001 |
| WO | WO 01/82389 A1 | 11/2001 |
| WO | WO 01/89006 A1 | 11/2001 |
| WO | WO 02/083411 A1 | 10/2002 |
| WO | WO 03/028903 A2 | 4/2003 |
| WO | WO-2003/046649 A1 | 6/2003 |
| WO | WO 2008/094352 A1 | 8/2008 |

OTHER PUBLICATIONS

M.A. Baldo et al., "Highly Efficient Phosphorescent Emission From Organic Electroluminescent Devices"; Letters to Nature; Sep. 1998; vol. 395; pp. 151-154.

M.A. Baldo et al., "Very High-Efficiency Green Organic Light-Emitting Devices Based on Electrophosphorescence"; Applied Physics Letters; Jul. 5, 1999; vol. 75; No. 1; pp. 4-6.

Tetsuo Tsutsui et al., "High Quantum Efficiency in Organic Light-Emitting Devices with Iridium-Complex as a Triplet Emissive Center"; JPN. J. Appl. Phys.; Dec. 15, 1999; vol. 38; Part 2; No. 12B; pp. L1502-L1504.

* cited by examiner

LIGHT EMITTING DEVICE INCLUDING A LAMINATION LAYER

This application is a Divisional of Ser. No. 10/426,971 Filed May 1, 2003, now U.S. Pat. No. 7,164,155 now Issued.

BACKGROUND OF THE INVENTION

1. Field of the Invention

The present invention relates to a light emitting device using an organic compound material as a luminescent material, and in particular, to the configuration of a light emitting device in which a plastic material is used as a substrate.

2. Description of the Related Art

Heretofore, a light emitting device utilizing a luminescence phenomenon with electroluminescence (hereinafter, referred to as EL) has been investigated so as to be applied as a means for forming image that represents information such as characters and images. Among inorganic compound materials, zinc sulfide has been known as a typical luminescent material (EL material) that generates EL. On the other hand, among organic compound materials, an aluminum tris(8-hydroxyquinoline) (Alq3) complex has been known as a typical EL material.

The light emitting element using such an EL material has a comparatively simple structure and contains a luminescent material included in a coating film of several hundreds nanometers between a pair of electrodes. From the view point of diversity of the material, it is considered that the luminescent material containing the organic compound material is superior to one containing the inorganic compound material. Initially, it was concerned that the life of light emission was short. In recent years, however, an organic compound material having a brightness half life of over 10,000 hours has been developed.

The light emitting device adapted to various kinds of applications such as a lighting means or a displaying means by the use of a light emitting element obtains additional advantages of weight saving, low-profiling, resistance to breakage, flexibility, and so on. Therefore, the values as a charming product can be expected.

However, there is a problem in that the plastic material has low heat resistance properties compared a glass material. Even though such a problem can be overcame by decreasing the process temperature, it is difficult to implement a light emitting device having such a plastic material as a substrate because the plastic material has the property of allowing the transmission of oxygen and moisture content, and the property of occluding oxygen and moisture content and releasing them again depending on the temperature. In other words, there is a problem that the organic compound material or which is one of the structural components of the light emitting device or an anode material using the alkali metal can be influenced and the light-emitting function thereof can be decreased.

For solving such a problem, for example, the following methods are disclosed. That is, a method of using a material having high moisture barrier properties such as a fluorine film as a plastic material, a method of forming a thin film layer containing one or two or more of materials selected from metal fluorides and magnesium oxides essentially containing silicon oxide as disclosed in JP8-167475, a method of forming a gas-barrier layer by laminating inorganic nitride and inorganic oxide as disclosed in JP8-68990. In the U.S. Pat. No. 6,268,695, there is disclosed a laminate structure as a barrier layer in which polymer layers and ceramic layers are laminated one after another.

However, the fluorine film is expensive and a sufficient thickness of the film is required for attaining sufficient gas-barrier properties. As a result, there is a problem of lowering transmissivity. In addition, the coating film made of the inorganic compound such as nitride or oxide has a high internal stress, so that the plastic substrate can be deformed when the coating film is thickened. On the other hand, if the coating film is thinned, a sufficient gas barrier property cannot be obtained and a pin hole or the like tends to be caused. Therefore, there is a problem in that a sufficient effect as a sealing material cannot be obtained. Furthermore a fine film made of silicon oxide or silicon cannot be obtained if the material is not heated to the heat-resistance temperature or more of the plastic material. On the other hand, when the temperature decreases, the coating film becomes coarse and the gas barrier property decreases. These features are mutually contradictory, so that the plastic substrate cannot be coated with a fine film.

Furthermore, silica, alumina, titanium oxide, indium oxide, tin oxide, indium tine oxide (ITO, indium oxide mixed with tin oxide), aluminum nitride, silicon nitride, or the like selected as a ceramic layer has brittleness, so that it may be not always preferable to use a flexible plastic material as a substrate. In addition, it becomes possible to endure some degree of bending if the ceramic layer is formed as a thin film. In this case, however, the probability of generating a pin hole increases and so on, resulting in a decrease in gas barrier property.

SUMMARY OF THE INVENTION

In consideration of the above circumstances, an object of the present invention is to provide a light emitting device using a plastic material as a substrate, which is capable of preventing the substrate from deterioration with the transmission of oxygen or moisture content.

For solving the above problems, a lamination layer is formed on the principle surface of a substrate made of a plastic material to prevent the substrate from deterioration with the transmission of oxygen or moisture content, and functional elements including light emitting elements are formed on the lamination layer. Furthermore, an inorganic compound layer having gas barrier properties is also formed on these functional elements and the inorganic compound layer and the surface or end surface of the lamination layer are laminated together on the outside of the functional elements or functional element groups to form a sealed sealing structure.

The plastic material may be selected from polyether sulphone, polyallylate, polyimide, polyamide, acryl resin, epoxy resin, polyethylene terephthalate, polyethylene naphthalate, and polycarbonate. In addition, other plastic materials well known in the art may be used as far as they have some degrees of heat resistance and mechanical strength enough to form functional elements.

The lamination layer may be a laminate of a metal layer and an organic compound layer. As a metal material, aluminum is particularly preferable because of its comparatively soft and flexible structure. Other metal materials usable in the present invention may include chromium, titanium, tungsten, stainless steel alloy, and so on. In this case, there is a need of forming the film of 5 nm or less in thickness and making the film difficult to be cracked when the plastic substrate is bent. The organic compound layer is provided for relaxing the stress, and is selected from heat-curing or photo-curing organic resin materials, typically a polyimide resin or an acryl resin.

The light emitting device of the present invention having the above requirements comprises light emitting elements formed between a lamination layer and an inorganic compound layer that transmits visual light, where the lamination layer is constructed of one unit or two or more units, and each unit is a laminated structure of a metal layer and an organic compound layer. Alternatively, the light emitting device comprises: light emitting elements formed between a lamination layer and an inorganic compound layer that transmits visual light, where the lamination layer is constructed of one unit or two or more units, and each unit is a laminated structure of a metal layer and an organic compound layer, wherein the inorganic compound layer is formed so as to cover the end face of the lamination layer.

In such a configuration of the present invention, a thin film transistor (hereinafter, referred to as TFT) connected to the light emitting element may be formed in matrix form to provide a pixel portion. The pixel portion may be arranged between the lamination layer and the inorganic compound layer.

A light emitting device of the present invention comprises a pixel portion having light emitting elements in which a luminescent layer containing a luminescent material made of an organic compound between a first electrode and a second electrode connected to a plurality of pixels and extended in one direction, and wiring connected to the first electrode and extended in the direction intersecting the one direction, wherein the pixel portion is formed between a lamination layer and an inorganic compound layer that transmits visual light, where the lamination layer is constructed of one unit or more units, and each unit is a laminated structure of a metal layer and an organic compound layer. The inorganic compound layer may be formed so as to cover the end face of the lamination layer.

An intermediate layer may be formed between the lamination layer and the light emitting element, between the lamination layer and the TFT, or between the lamination layer and the pixel portion.

In the configuration of the lamination layer, the metal layer may be formed of aluminum or aluminum alloy, and the organic compound layer may be formed of a heat-curable or photo-curable resin material.

In a typical mode of the light emitting element used in the present invention, a layer containing the above luminescent material is placed between a pair of electrodes divided into a cathode and an anode depending on their polarities. The layers can be functionally represented by a luminescent layer, a hole-injection layer, a electron-injection layer, a hole transport layer, a electron transport layer, and so on. As an extremely simple configuration, the structure may be of a laminate of anode/luminescent layer/cathode, which are laminated in that order. In addition to such a structure, other structures such as anode/hole-injection layer/luminescent layer/cathode and anode/hole-injection layer/luminescent layer/electron transport layer/anode may be allowable. Furthermore, instead of such a distinctly divided laminate structure, the structure may be provided as a composite or mixture, where the layers are hardly distinguished from each other. In the following description, all kinds of these structures will be included in the term of an EL layer.

In the above configuration of the light emitting device, the lamination layer is provided on the principal surface of the plastic substrate to permit the substrate to be prevented deterioration with the transmission of oxygen or moisture content. Furthermore, the flexible substrate structure can be obtained.

DESCRIPTION OF THE PREFERRED EMBODIMENTS

Figure 1:
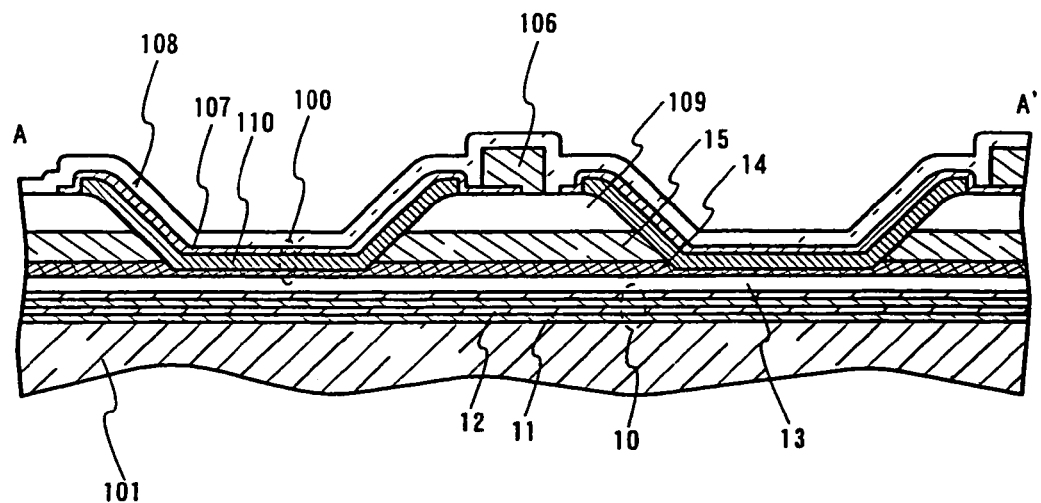
FIG. 1 is a vertical cross sectional diagram that illustrates the pixel structure of the light emitting device of the present invention, in which the lamination layer is formed on the substrate.

Hereinafter, we will describe preferred embodiments of the present invention in detail with reference to the attached drawings.

As a plastic substrate to be used in the present invention, polyether sulphone, polyallylate, polyimide, polyamide, acrylic resin, epoxy resin, polyethylene terephthalate, polyethylene naphthalate, or polycarbonate may be applied. In the following embodiments, therefore, one of these plastic substrates can be appropriately selected.

One of the main structural components of the invention is a lamination layer comprised of a unit or a plurality of units, where each unit is provided as a laminate structure of a metal layer and an organic layer. The lamination layer is formed on the whole principal surface of a plastic substrate on which light emitting elements are formed. A material that forms the metal layer is pure aluminum, or alternatively it may be aluminum added with 0.1 to 5% by weight of an impurity selected from scandium, titanium, niobium, silicon, and copper. The reason of adding these impurities is to improve the stability of aluminum and to prevent aluminum spike and migration. For providing the laminate with flexibility, each layer has a thickness of 10 to 100 nm and is prepared by a magnetron spattering method or a vacuum deposition method.

A material for forming the organic compound layer may be selected from heat-curing or photo-curing acryl compounds including methylester acrylate, ethylester acrylate, butylester acrylate, and 2-ethylhexylester acrylate; and heat-curing or photo-curing acryl, polyimide, polyamide, urethane, epoxy, epoxyamine, cyanoacrylate, polyethylene-imine, and butadiene resin materials. The thickness of the organic compound layer is in the range of 0.1 to 10 μm. In the above plastic substrate, a filler is contaminated. Thus, when the surface of the plastic substrate has asperities with heights of several micrometers to several tens micrometers, such an uneven surface can be flattened by the organic compound flattens.

The order of laminating the metal layer and the organic compound is not limited. They may be laminated in the order of the metal layer to the organic compound layer from the plastic substrate side or in the reverse order thereof. The resulting laminate structure is provided as one unit, and then a layer product is prepared using one unit or more units. However, the number of the units may be appropriately selected for attaining the purpose of preventing the diffusion of oxygen or moisture content. That is, the metal layer is laminated for making the lamination layer so as to have a thickness substantially equal to the thickness enough to prevent the diffusion of oxygen or moisture content. In the configuration of the lamination layer of the present invention, the thickness of the metal layer per layer (i.e., the thickness of the aluminum film) is defined such that it does not prevent the flexibility of the plastic substrate. In addition, it should be the thickness that does not cause any damage such as cracking at the time of bending the plastic substrate. Therefore, it is designed such that a plurality of thin metal layers is laminated. Each organic compound layer inserted between the layers exerts a function of relaxing the stress thereof.

Figure 18A:
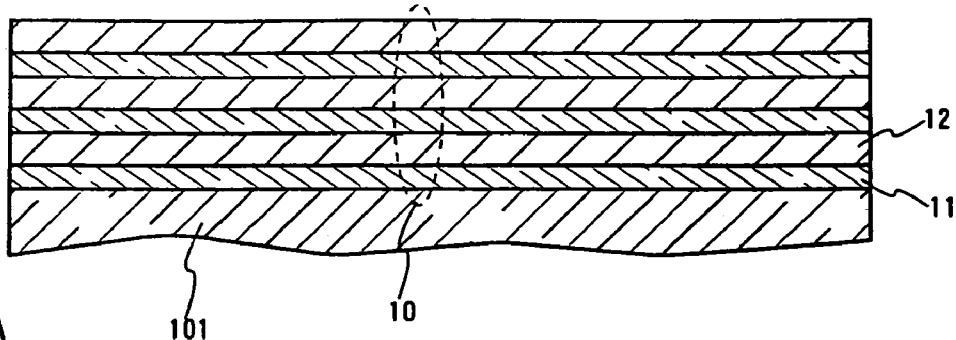
FIGS. 18A and 18B are cross sectional diagrams for illustrating the details of the lamination layer of the present invention.
Figure 18B:
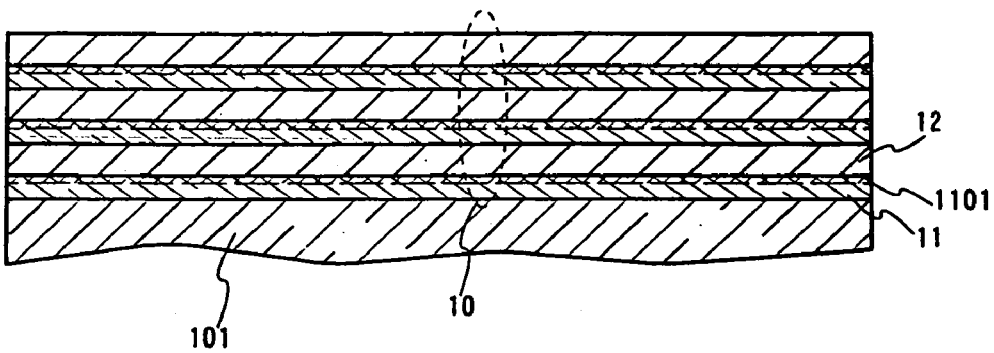

FIGS. 18A and 18B are diagrams that illustrates a detailed configuration of the lamination layer. On a plastic substrate 101 to be applied in a light emitting device of the present invention, a metal layer 11 and an organic compound layer 12 are laminated one after another to form a lamination layer 10. Then, the resulting laminate structure is provided as a unit. A lamination layer comprised of one unit or a plurality of units is formed on a principal surface of the plastic substrate to prevent the diffusion of oxygen or moisture content from the substrate side. In addition, the laminated product is able to prevent the generation of oligomer on the surface of the plastic substrate as a synergistic effect. FIG. 18(B) is another configuration of the lamination layer, by which the interaction between the metal layer and the organic compound layer can be prevented. A passive layer 1101 may be formed on the metal layer 11 by oxidizing or nitriding the metal layer 11 to stabilize the surface of the metal layer 11. In the case of aluminum as a metal layer, aluminum oxide or aluminum nitride is formed. For instance, it becomes possible to prevent the metal layer from corrosion damage when a material containing an amino complex or the like is used in the organic compound layer.

Figure 19A:
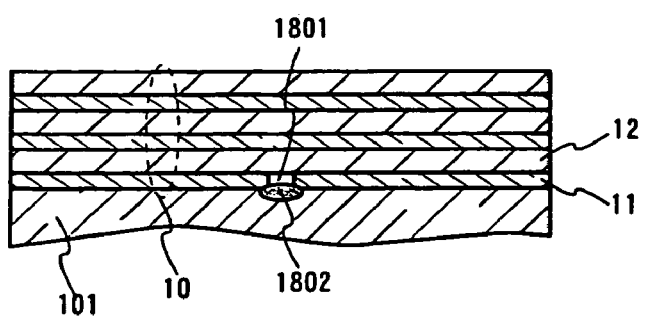
FIGS. 19A and 19B are cross sectional diagrams for illustrating the details of the lamination layer of the present invention.
Figure 19B:
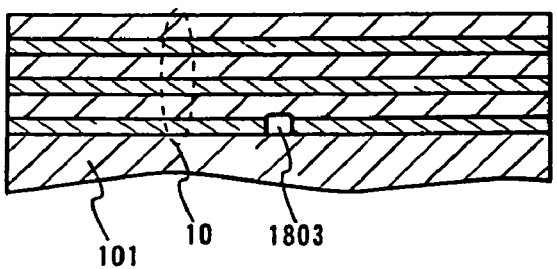

In the case of forming a metal layer of 10 to 100 nm in thickness, as shown in FIG. 19A, a bole 1801 may be undesirably formed in the metal layer 11. If such a bole 1801 is formed in the metal layer 11, oxygen or moisture content 1802 tends to permeate through the hole 1801. In the case of forming the metal layer 11 with aluminum, however, an oxidation reaction is initiated at that portion even though the moisture content 1802 is dispersed therein. As a result, as shown in FIG. 19(B), alumina 1803 can be formed in the hole 1801 to seal the hole 1801. For positively initiating such a reaction, it is preferable to conduct a heat treatment, preferably a water vapor treatment after the formation of the laminated product.

Figure 17:
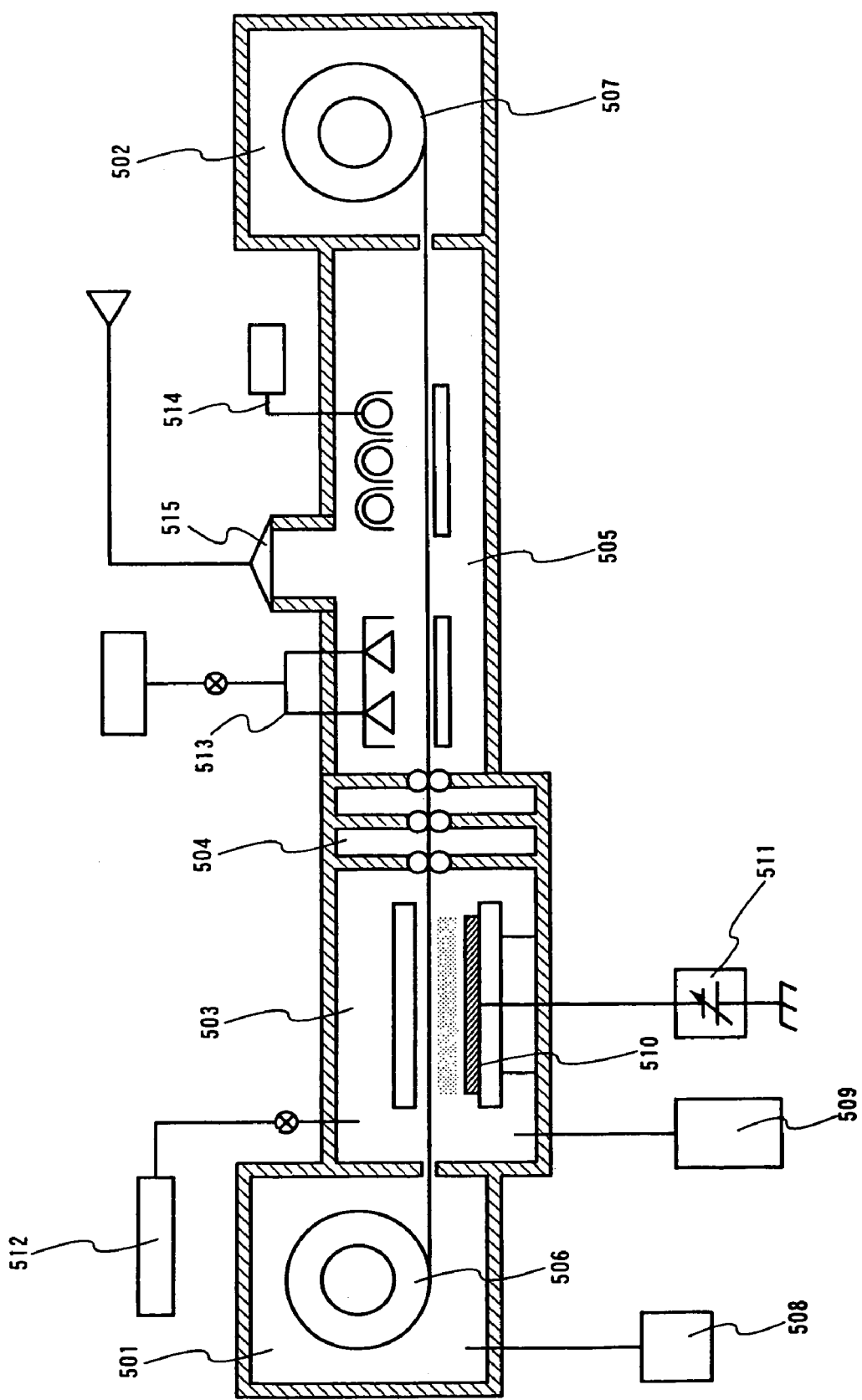
FIG. 17 is a diagram that indicates one embodiment of the manufacturing device adapted to the formation of the lamination layer of the present invention on the flexible plastic substrate.

FIG. 17 is a diagram that illustrates an example of a manufacturing device that allows a continuous production of a laminated product comprised of a metal layer and an organic resin layer on a flexible plastic substrate. The manufacturing device is configured as follows. That is, a plastic substrate is placed in a feed chamber 501. Long lengths of plastic substrate is fed without break between a cylindrical can 506 around which long lengths of plastic substrate is wound and another cylindrical can 507 placed in a winding chamber 502. During this period, the metal layer and the organic compound layer are formed. Furthermore, there is a film-forming chamber 503 for the formation of a metal layer and a film-forming chamber 505 for the formation of an organic compound layer between the feed chamber 501 and winding chamber 502. The feed chamber 501 and the film-forming chamber 503 for the metal layer are equipped with exhaust means 508, 509, respectively, allowing to maintain a reduced pressure state. An intermediate chamber 504 is formed between the film-forming chamber 503 for the metal layer and the film-forming chamber 505 for the organic compound layer to adjust a pressure difference. In the case of forming a metal film in the film-forming chamber 503 using a magnetron spattering method, a gas-inducing means 512, a target 510, an electric source 511, and so on are provided. On the other hand, the formation of an organic compound layer may be performed using a splay method, an application method, a drug-solution dropping method, and so on. In FIG. 17, the film-forming chamber 505 for the organic compound layer comprises an application means 513 for applying an organic compound medium, a drying means 514 such as a halogen lamp or a sheath heater, and an exhaust duct 515. Consequently, the manufacturing device shown in FIG. 17 allows the formation of the lamination layer having the above configuration on the plastic substrate. For forming a lamination layer having a plurality of the above units, the process of forming the metal layer and the organic compound layer may be repeated as many as the number of units.

Hereinafter, we will describe the preferred embodiments of the present invention with reference to the attached drawings, where they are commonly comprised of the above plastic substrate and the laminated product on the main surface of the plastic substrate.

Embodiment 1

In this embodiment, a light emitting device is of a simple matrix type, in which light emitting elements are arranged in a matrix form to constitute a display screen. In this embodiment, we will describe an embodiment of sealing structure for protecting the light emitting elements from external contaminations such as oxygen and water vapor.

Figure 3:
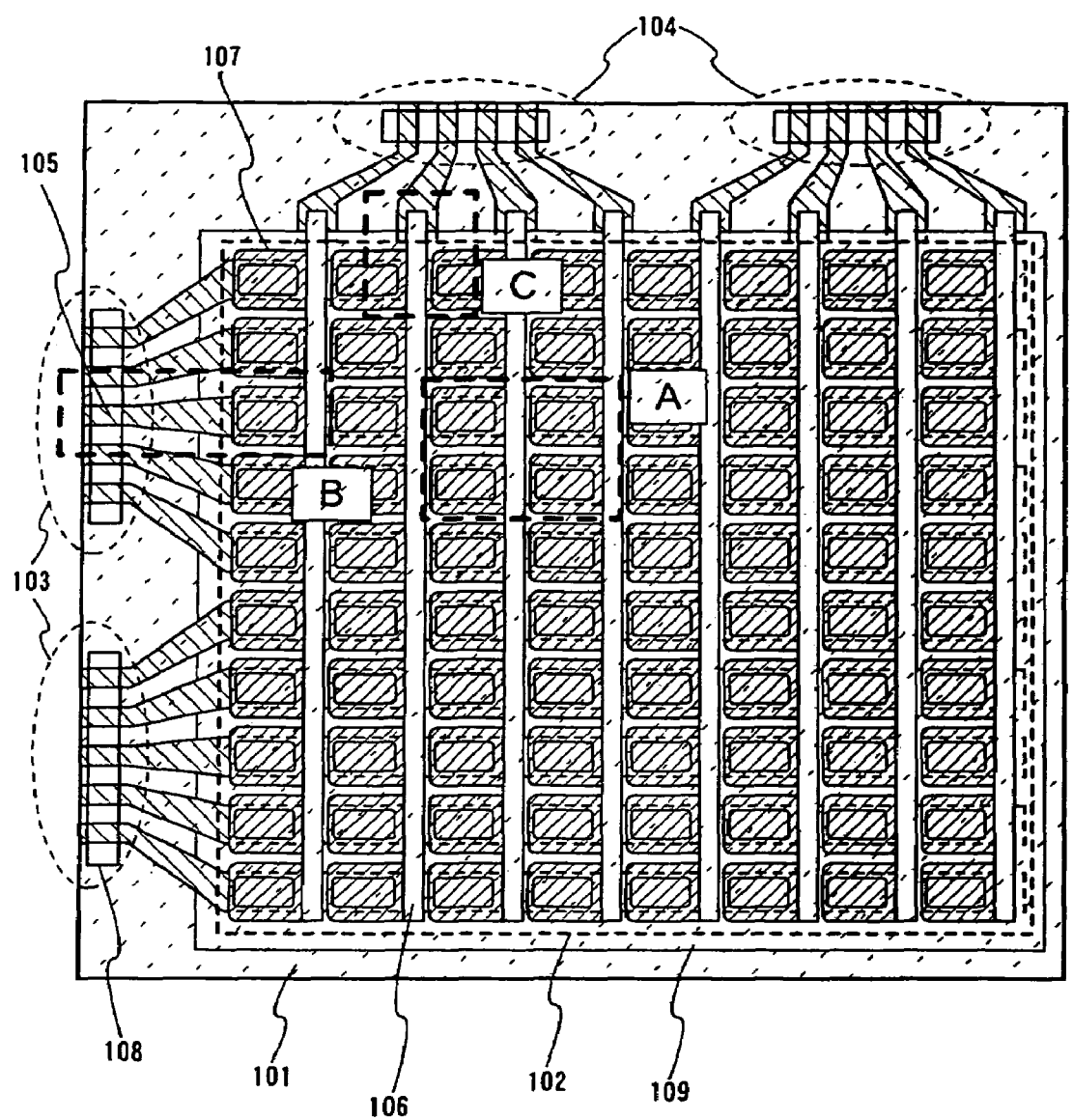
FIG. 3 is a top view for illustrating the configuration of the light emitting device of the present invention.

FIG. 3 is a top view for illustrating the configuration of the sealing structure. As shown in the figure, a pixel portion 102 is formed, where light emitting elements are arranged in a matrix form on a substrate 101. The pixel portion 102 includes a first wiring 105 in a stripe form extending in the X direction and a second wiring 106 in a stripe form extending in the Y direction. A first electrode 107 of the light emitting element is electrically connected to the second wiring 106. The stripe-formed first wiring 105 in the X direction and the stripe-formed second wiring 106 in the Y direction form their respective signal input terminals 103, 104 on the ends of the substrate 101, respectively. A partition wall layer 109 is formed on the inside of the substrate 101 such that it is located some distance from the end of the substrate 101. An inorganic compound layer 108 is formed over the structural components on the substrate 101 except of the signal input terminals 103, 104.

Figure 4:
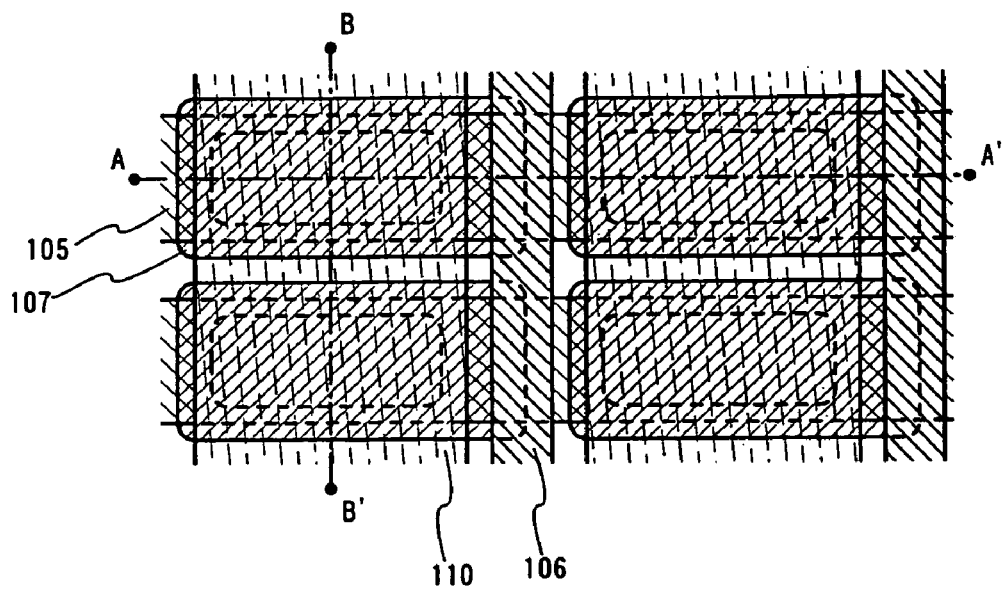
FIG. 4 is a top view for illustrating the detailed configuration of the pixel portion of the light emitting device of the present invention.
Figure 5:
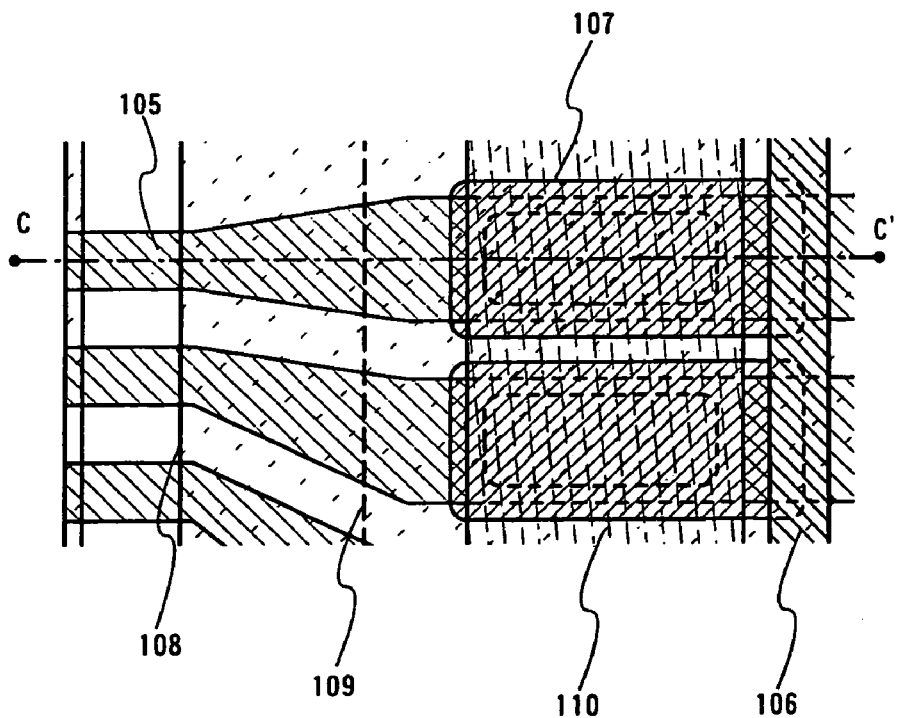
FIG. 5 is a top view for illustrating the detailed configuration of the input terminal of the light emitting device of the present invention.
Figure 6:
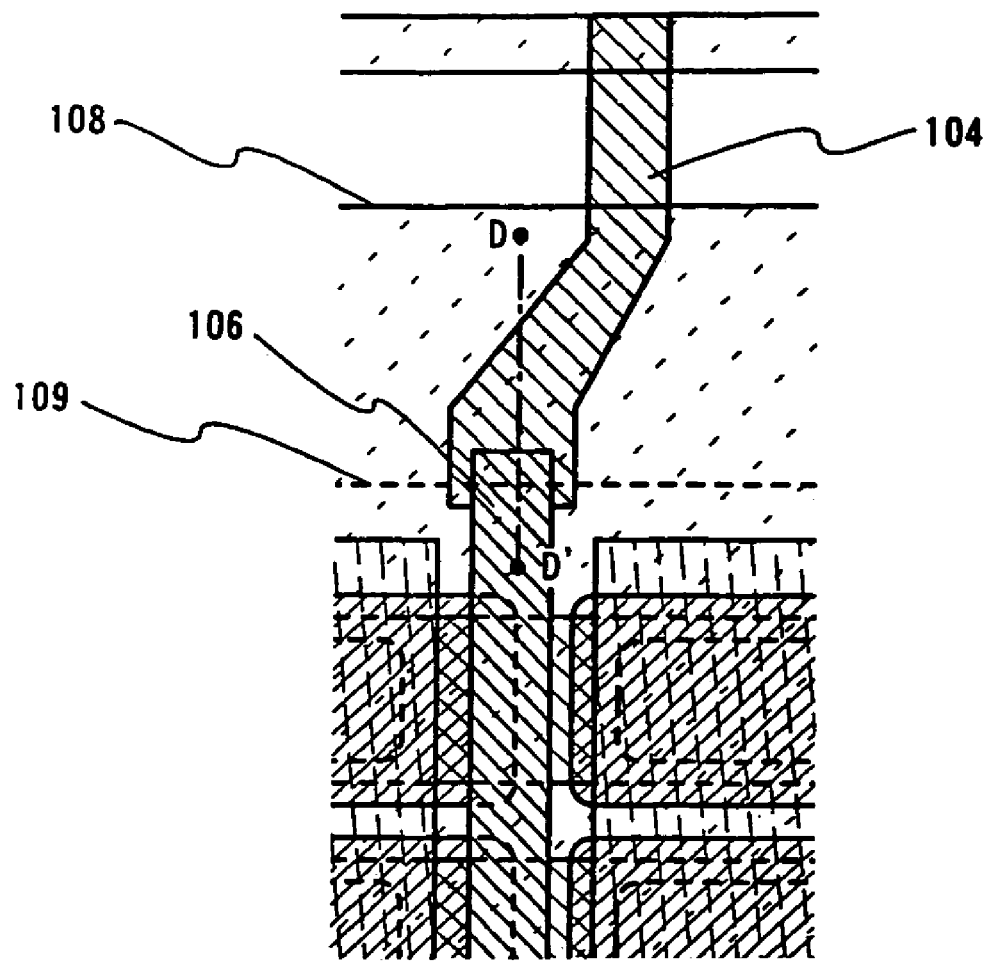
FIG. 6 is a top view for illustrating the detailed configuration of the input terminal of the light emitting device of the present invention.

In the pixel portion 102, the area surrounded by a dotted line and denoted by the alphabet A in FIG. 3 (an A region) is shown in FIG. 4 in more detail. In addition, the signal input terminals 103, 104 surrounded by dotted lines and denoted by B and C (B and C regions) are shown in FIG. 5 and FIG. 6 in more detail, respectively.

In FIG. 4 that shows the details of the A region, the stripe-shaped first wiring 105 extending in the X direction and the stripe-shaped second wiring 106 extending in the Y direction are crossed each other through a partition wall layer (not shown). The light emitting element is formed on a portion where the first electrode 107 provided so as to be fit to an opening of the partition wall layer and the first wiring 105 are overlapped each other. An electroluminescent (EL) layer 110 containing a luminescent material is formed between the first electrode 107 and the first wiring 105.

Figure 2:
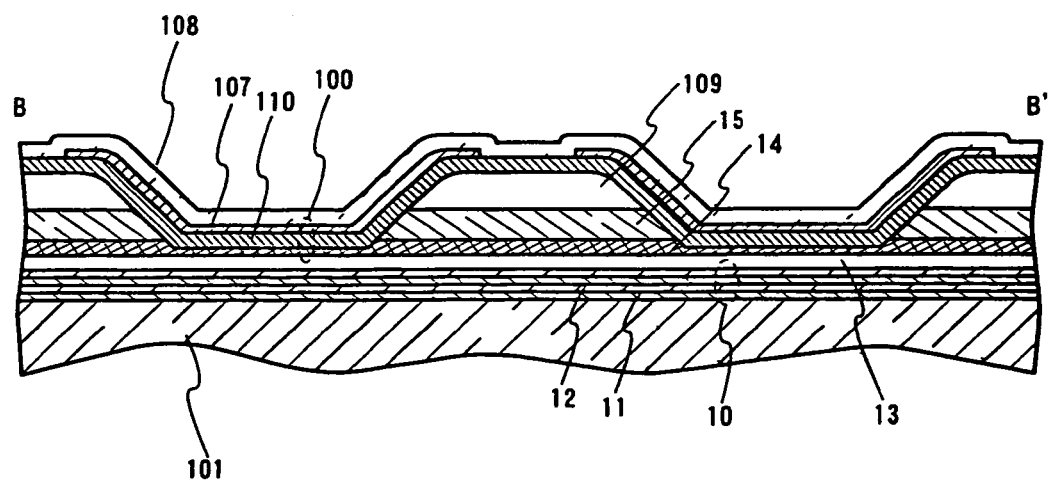
FIG. 2 is a vertical cross sectional diagram that illustrates the pixel structure of the light emitting device of the present invention, in which the lamination layer is formed on the substrate.

Vertical cross sectional diagrams taken along the lines A-A' and B-B' of FIG. 4 are shown in FIG. 1 and FIG. 2, respectively. In FIG. 1 which is the cross sectional view along the line A-A' of FIG. 4, on the principal surface of the substrate 101, there is provided a lamination layer 10 comprised of a plurality of units, each of which consists of a laminate structure constructed of a metal layer 11 and an organic compound layer 12. Alternatively, the lamination layer 10 may be comprised of a laminate structure constructed of one metal layer 11 and one organic compound layer 12. Light-emitting elements 100 are formed on the lamination layer 10 through an intermediate layer 13. The light-emitting layer 100 is covered with the inorganic compound layer 108 to prevent the light-emitting layer 100 from the erosive action of oxygen or moisture content. Such a configuration can be also found in FIG. 2 which is the vertical cross sectional view along the line B-B' of FIG. 4.

The light emitting element 100 is constructed such that an electroluminescent (EL) layer 110 is sandwiched between a first electrode 107 and a second electrode 14. For functioning the second electrode 14 as an anode, a conductive material having a work function of 4 eV or more, such as indium tin oxide (ITO, indium oxide mixed with tin oxide), zinc oxide, indium zinc oxide (IZO, indium oxide mixed with zinc oxide), titanium nitride, or tungsten nitride is used. In addition, for functioning as a cathode, a conductive material having a work function of 4 eV or less is selected, and alloy or chemical compound material containing alkali earth metal or alkali metals such as AlLi or MgAg may be applied.

The EL layer 100 is prepared using a luminescent material and a electron-injection transport material containing an organic compound or an inorganic compound. Also, the EL layer 100 may be constructed of one or a plurality of layers, selected from lower molecular organic compounds, intermediate molecular organic compounds, and polymer organic compounds on the basis of their number of molecules, and may be combined with a electron-injection transport or hole-injection transport inorganic compound. Furthermore, the term "intermediate molecular compound" means an organic compound having no sublimate property and having a molecular weight of 20 or less, or having a linked molecular length of 10 μm or less.

The luminescent material may be a metal complex such as tris-8-quinolinolate aluminum complex or bis-(benzoquinolinorate) beryllium complex, phenyl anthracene derivative, tetra-aryl diamine derivative, or distyril benzene derivative may be used as a low molecular organic compound, and using the selected compound as a host material, coumarin derivative, DCM, quinacridon, rubrene, or the like may be need. Alternatively, it may be selected from other well-known materials. In addition, the macromolecular organic compound may be selected from polyparaphenylene vinylenes, polyparaphenylene, polythiophenes, polyfluorenes, and so on. Concretely, it may be selected from poly(p-phenylene vinylene): (PPV), poly(2,5-dialkoxy-1,4-phenyene vinylene): (RO-PPV), poly[2-(2'-ethylhexoxy)-5-methoxy-1,4-phenylene vinylene]: (MEH-PPV), poly[2-dialkoxyphenyl)-1,4-phenylene vinylene]: (ROPh-PPV), poly[p-phenylene]: (PPP), Poly(2,5-dialkoxy-1,4-phenylene): (RO-PPP), poly(2,5-dihexoxy-1,4-phenylene), polythiophene: (PT), poly(3-alkylthiophene): (PAT), poly(3-hexylthiophene): (PHT), poly(3-cyclohexylthiophene): (PCHT), poly(3-cyclohexyl-4-methylthiophene): (PCHMT), poly(3,4-dicyclohexylthiophene): (PDCHT), poly[3-(4octylphenyl)-thiophene]: (POPT), poly[3-(4-octylphenyl)-2,2-bithiophene]: (PTOPT), polyfluorene (PF), poly(9,9-dialkylfluorene): (PDAF), poly(9,9-dioctylfluorene): (PDOF), and so on.

The electron-injection transport layer may be made of an inorganic compound material selected from diamond-like carbon (DLC), Si, Ge, and oxides or nitrides thereof, optionally doped with P, B, N, or the like in an appropriate manner. Furthermore, it may be oxides, nitrides or fluorides of alkali metals or alkali earth metal or compounds or alloys of these metals with one of at least Zn, Sn, V, Ru, Sm, and In.

The materials described above are taken as examples. Each of functional layers such as a hole-injection transport layer, a hole-transport layer, a electron-transport layer, a luminescent layer, a electron-blocking layer, and a hole-blocking layer can be prepared using these materials and a light-emitting element can be prepared by laminating the resulting layers. In addition, a composite layer or a mixed junction may be formed by combining these layers.

Figure 10:
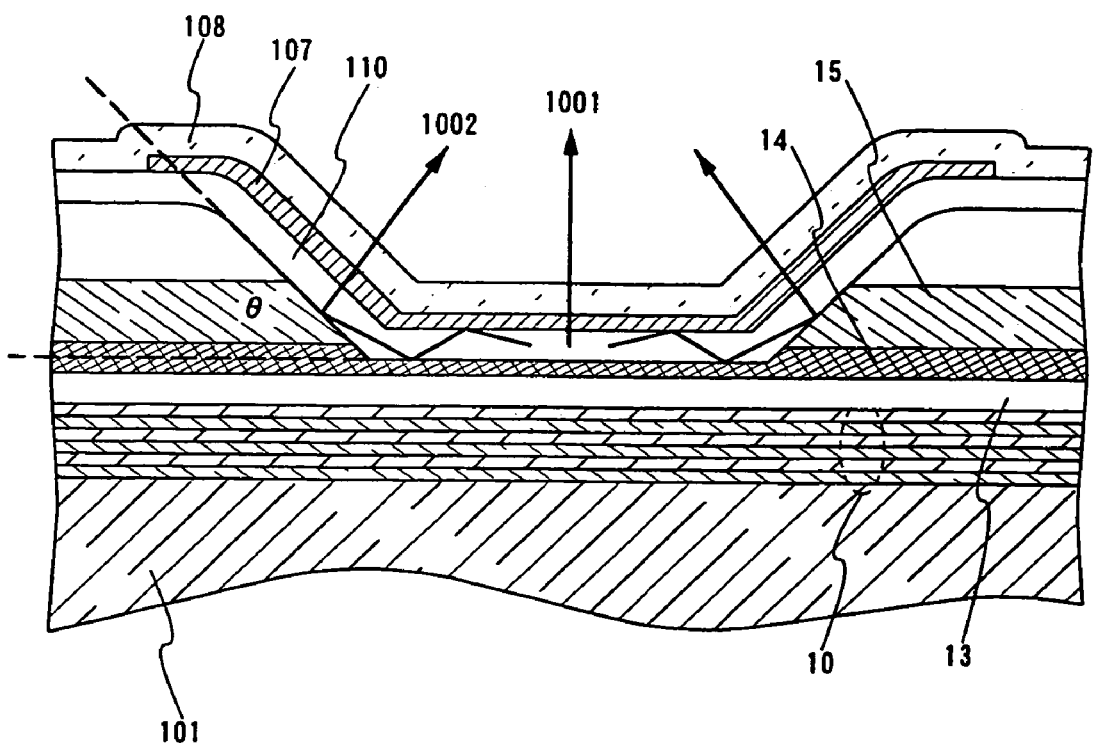
FIG. 10 is a vertical cross sectional diagram for illustrating the detailed configuration of the pixel of the light emitting device of the present invention.

In FIG. 1 and FIG. 2, a reflector 15 is formed between the second electrode 14 and the partition wall layer 109 and the side walls of which are exposed is made of a metal material having a high reflectivity as typified by aluminum. The reflector 15 is provided for preventing a decrease in external quantum efficiency the light emitted from the EL layer waveguide light by a multi-path reflection between the first electrode 107 and the second electrode 14 to lead to from becoming. The principle of such a phenomenon is schematically illustrated in FIG. 10. As shown in the figure, the reflector 15 acts effectively when the light 1002 is multiply reflected between the first electrode 107 and the second electrode 14 and becomes waveguide light in addition to light 1001 emitted from the EL layer 110 to the outside. The angle θ of the reflection surface of the reflector 15 may be in the range of about 30° to 75°, preferably 45° with respect to the principal surface of the substrate or the surface of the second electrode.

In FIG. 1, the stripe-shaped second wiring 106 extending in the Y direction is electrically contact with the first electrode 107 and extends to the partition wall layer 109. The second wiring 106 may be a conductive material such as aluminum, more preferably may be formed using a shadow mask with a vacuum deposition method.

Figure 7:
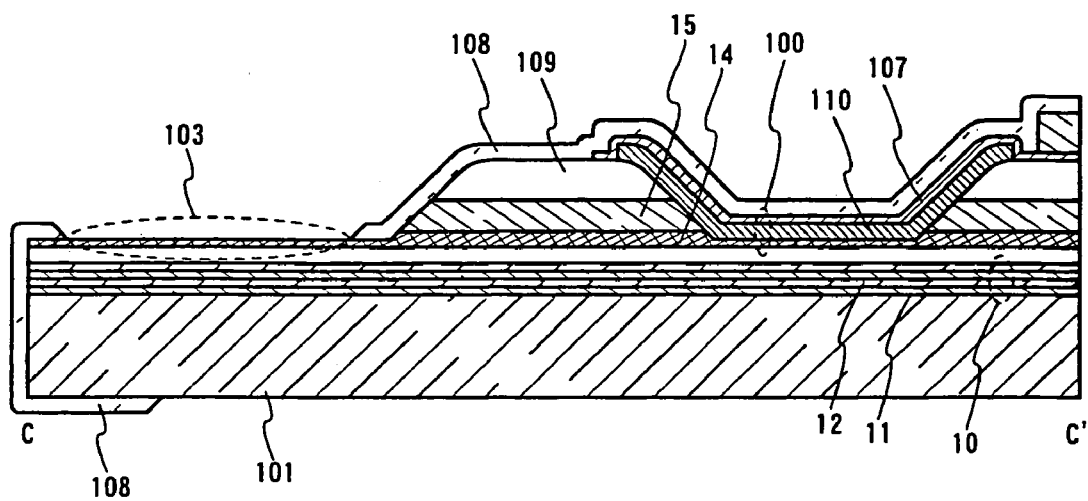
FIG. 7 is a vertical cross sectional diagram for illustrating the detailed configuration of the input terminal of the light emitting device of the present invention.

In FIG. 5 showing the details of the B region, there is illustrated the structure of the signal input terminal end and the vicinity thereof of the first wiring 105 extending in the X direction. Furthermore, a vertical cross sectional view along the line C-C' in FIG. 5 is shown in FIG. 7. Therefore, these portions will be described hereinafter with reference to both figures.

The signal input terminal 103 is formed on the same layer as that of the first wiring 105. That is, it is formed as a laminate of the second electrode 14 and the reflector 15. In addition, the signal input terminal 103 is designed such that trances thereof are allowed to be connected to a flexible print circuit (FPC) at the end of the plastic substrate 101 at a predetermined pitch. Even though the inorganic insulating layer 108 formed on the whole surface, a part of such a layer 108 corresponding to the signal input terminal 103 is removed so that the first wiring 105 is exposed. That is, excepting such a portion, the inorganic insulating layer 108 is formed so as to cover the side surface of the lamination layer 10 to increase the air-tightness to prevent the entry of oxygen and moisture content from the outside.

Figure 8:
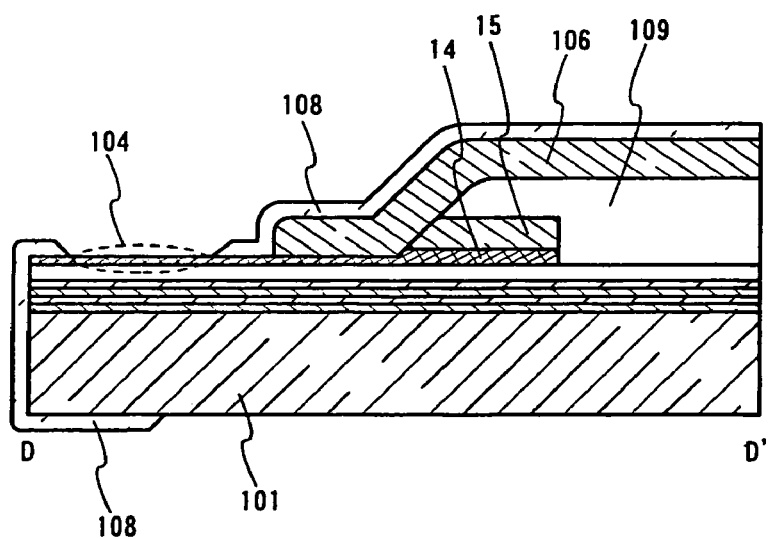
FIG. 8 is a vertical cross sectional diagram for illustrating the detailed configuration of the input terminal of the light emitting device of the present invention.

In FIG. 6 showing the details of the C region, there is illustrated the structure of the signal input terminal end and the vicinity thereof of the second wiring 106 extending in the Y direction. Furthermore, a vertical cross sectional view along the line D-D' in FIG. 6 is shown in FIG. 8. Therefore, these portions will be described hereinafter with reference to both figures.

The signal input terminal 104 is formed of the same material as that of the first wiring 105. That is, it is formed of a laminate of the second electrode 14 and the reflector 15. In addition, the signal input terminal 104 is electrically connected to the second wiring 106 on the outside of the partition wall layer 109. Even though the inorganic insulating layer 108 is formed on the whole surface, a part of such a layer 108 corresponding to the signal input terminal 104 is removed so that the surface of the second electrode 14 is exposed. That is, excepting such a portion, the inorganic insulating layer 108 is formed so as to cover the end and side surfaces of the substrate 101 to prevent the entry of oxygen and moisture content from the outside. In FIG. 5 and FIG. 6, the configuration of the light emitting element 100 is similar to one described above, so that explanations thereof will be omitted.

Consequently, as described above, a light emitting device having a simple matrix type of pixel portion constructed of light emitting elements 100, first wiring 105, second wiring 106, and terminals 103, 104 is fabricated. In the following description, furthermore, we will describe the process for manufacturing the light emitting element 100 in detail with reference to FIG. 9.

Figure 9A:
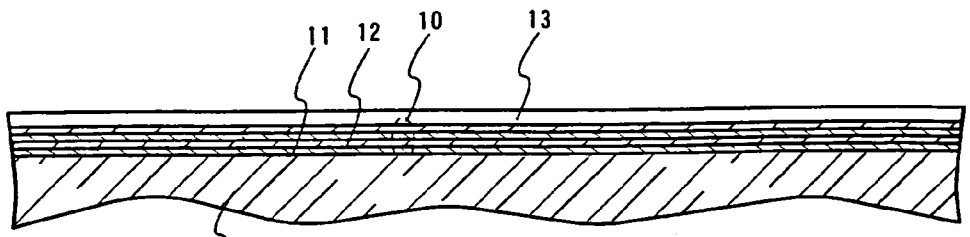
FIGS. 9A-9E are vertical cross sectional diagrams for illustrating the process for manufacturing the light emitting device of the present invention.

In FIG. 9A, an aluminum layer of 10 to 100 nm in thickness is formed as a metal layer 11, and a polyimide layer of 0.1 to 10 μm in thickness is formed as an organic compound layer 12, such that these layers are laminated one after another to form a lamination layer 10 on a plastic substrate 101. An intermediate layer 13 is formed as a silicon nitride film of 50 to 200 nm in thickness by a high-frequency magnetron spattering method using silicon as a target without the addition of hydrogen.

Figure 9B:
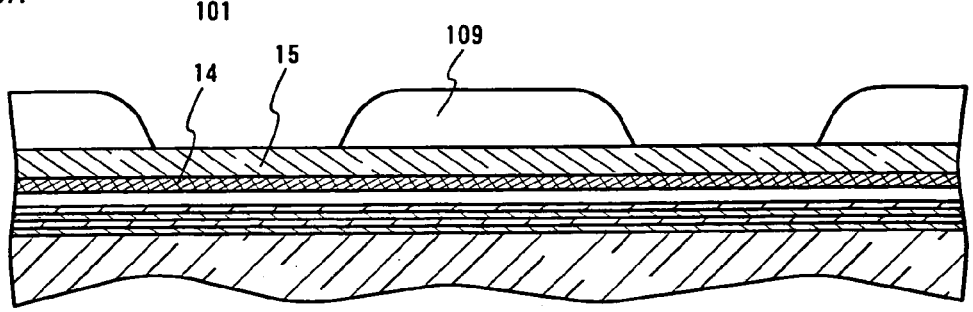

Next, as shown in FIG. 9B, a titanium nitride film of 100 to 500 nm in thickness is formed as a second electrode 14 and an aluminum film of 100 to 1000 nm in thickness is formed as a reflector 15 thereon using a magnetron spattering method. Furthermore, using a photosensitive organic resin material such as polyimide or acryl, a partition layer 109 having an opening pattern corresponding to the position of a pixel is formed so as to have a thickness of 0.5 to 5 μm. As the photosensitive organic resin material is used, the side wall of the opening is sloped. In addition, each of the apical and bottom end portions of the opening is formed so as to have a gentle curvature.

Figure 9C:
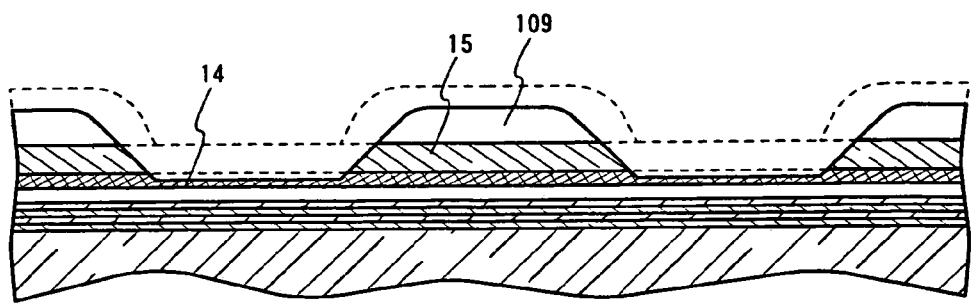

Using the partition layer 109 as a mask, an aluminum film that forms a reflector 15 is etched with a dry etching as shown in FIG. 9C. As an etching gas, a chlorine gas such as $BCl_3$ or $Cl_2$ is used. The etching is performed while moving the end of the partition wall layer 109 backward to etch the aluminum of the reflector 15 such that the side wall of the opening is processed so as to be slanted. That is, the surface of the reflector 15 to be exposed to the opening is sloped so as to have an angle of slope. In addition, the selective ratio to the titanium nitride film located on the lower side of the laminate is the higher the better. Alternatively, as shown in the figure, a part of the titanium nitride film may be partially etched. It is important that a smooth surface is formed without any abnormality in the shape such as a protrusion on the side wall.

Figure 9D:
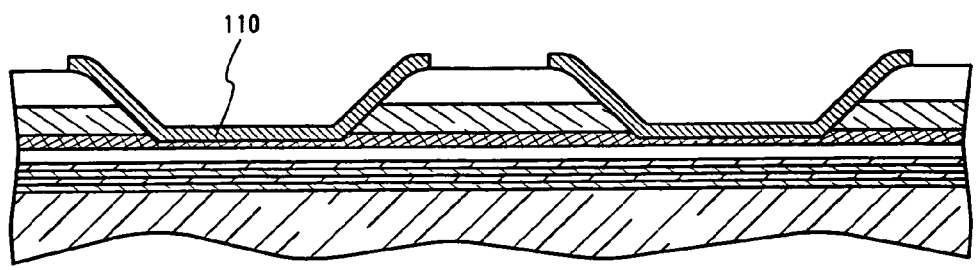

It is preferable to selectively form the EL layer 110 using a shadow mask with vacuum deposition method, an inkjet recording method, or the like as shown in FIG. 9D. The laminating configuration and the illuminated color are arbitrary, so that the illuminated color may be changed to red (R), green (G), or blue (B) per pixel or a white-luminescent layer may be formed.

In an appropriate combination between a color filter and a color-converting layer, it is preferable to have white luminescence. When the white luminescence cannot be obtained with a single pigment included in a luminescent layer, a plurality of pigments is used as a luminescence center and simultaneously emitted to make white luminescent by means of an additive color mixture. In this case, a method for laminating a luminescent layer having a different illuminated color, a method for containing a plurality of luminescence centers in one or a plurality of luminescent layers, or the like can be applied. With respect to the method for obtaining white luminescence, there are two methods. One is a method by laminating luminescent layers that respectively emit three primary colors, red (R), green (G), and blue (B), and performing an additive color mixture. The other is a method utilizing the relationship of two additive complementary colors. In the case of using additive complementary colors, a combination of blue and yellow or cyan and yellow are known. In particular, it is considered that the latter is advantageous because of utilizing a luminescent at a high wavelength region with a comparatively high visual sensitivity.

An example of the use of a low molecular organic light-emitting medium for the EL layer 110 is a laminate structure in which a electron-injection transport layer, a red luminescent layer, a green luminescent layer, a hole-transport layer, and a blue luminescent layer are laminated on a second electrode 14 one after another. Concretely, when the hole-transport layer is prepared using 1,2,4-triazole derivative (p-EtTAZ) and is provided with a film thickness of 3 nm, the amount of holes passing through the p-EtTAZ layer increases and holes are also injected into aluminum tris(8-hydroxyquinoline) (Alq3) used as a green luminescent layer, allowing luminescence. This kind of the structure acts as a blue luminescent layer such that cyan luminescence can be obtained as a mixture of blue luminescence from TPD and green luminescence from Alq3. In addition, for realizing white luminescence by adding red into the cyan luminescence, a red-luminescent pigment may be doped in either Alq3 or TPD to provide a red luminescent layer. The red luminescent pigment may be Nile Red or the like.

As another configuration of the EL layer 110, from the second electrode 14, a electron-injection transport layer, a electron transport layer, a luminescent layer, a hole transport layer, and a hole-injection transport layer may be laminated one after another. In this case, an appropriate combination of the materials include a electron-injection transport layer made of Alq3 of 15 nm in thickness and a electron transport layer made of a phenyl anthracene derivative of 20 nm in thickness. In this case, furthermore, a luminescent layer is constructed of: a fist luminescent layer of 25 nm in thickness prepared by mixing tetra-aryl benzine derivative and a phenyl anthracene derivative at a volume ratio of 1:3 with the addition of 3% by volume of styryl amine derivative; and a second luminescent layer of 40 nm in thickness prepared by mixing tetra-aryl benzine derivative and 10,10'-bis[2-biphenylil]-9,9'-bianthryl(phenylanthracene derivative) at a volume ratio of 1:3 with the addition of 3% by weight of naphthacene derivative. Furthermore, a hole transport layer of 20 nm in thickness is prepared from N,N,N',N'-tetrakis-(3-biphenyl-1-il)benzeidine(tetra-aryl benzidine derivative) and a hole injection layer of 30 nm in thickness is prepared from N,N'-diphenyl-N,N'-bis[N-phenyl-N-4-tolyl(4-aminophenyl)]benzidine.

In the above structure, an inorganic electron-injection transport layer may be used as the above electron-injection transport layer. In addition, as the above inorganic electron transport layer, n-type diamond-like carbon (DLC) may be used. The n-type DLC film can be obtained by appropriately doping phosphorus or the like into DLC. Alternatively, the inorganic electron transport layer may be prepared from one oxide selected from alkali metal elements, alkali earth metal elements, on lanthanoide elements and one or more of inorganic materials selected from Zn, Sn, V, Ru, Sm, and In.

Figure 9E:
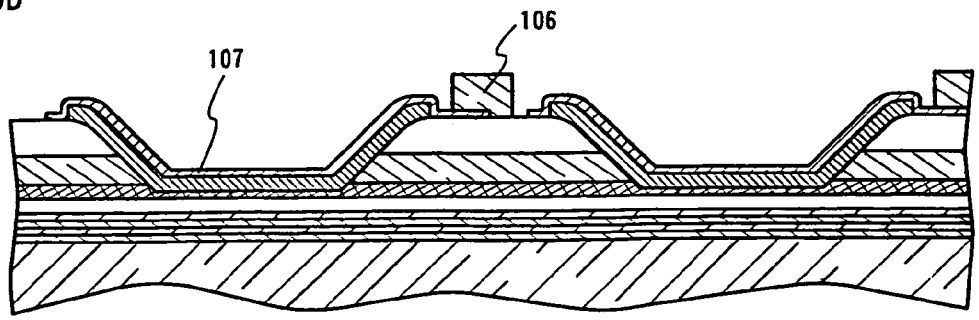

After that, as shown in FIG. 9E, a first electrode 107 is formed from an aluminum film containing 5 to 50 nm of lithium. In addition, a second wiring 106 is formed of aluminum on the partition wall layer 109 using a vacuum deposition method. Subsequently, a silicon nitride film is formed as an inorganic insulating layer by a high-frequency magnetron spattering method using silicon as a target, resulting in a pixel structure illustrated in FIG. 1.

Figure 11:
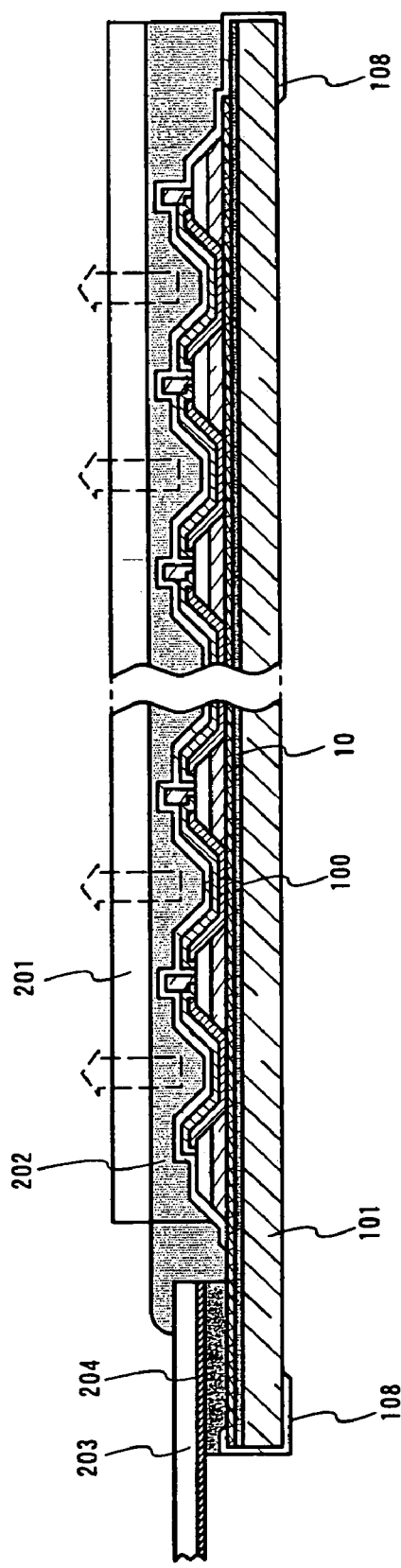
FIG. 11 is a vertical cross sectional diagram for illustrating the configuration of the light emitting device of the present invention.

Referring now to FIG. 11, there is shown the configuration of a light emitting device attached with a sealing plastic substrate 201 and a FPC as one of the preferred embodiments of the present invention. A sealing plastic substrate 201 is fixed on a plastic substrate 101 (on which light emitting elements 100 are formed) by means of a resin material 202 such as a urethane resin, an epoxy resin, or a silicon resin. Also, a FPC is fixed on a signal input terminal 103 by fixing together by means of an anisotropic conductive adhesive 204 so as to be electrically connected to each other. Likewise, a signal input terminal 104 is also connected to the FPC. Each of the light emitting elements 100 is completely surrounded by a lamination layer 10 and an inorganic insulating layer 108 to form a sealed structure independently from the sealing plastic substrate 201 and the resin material 202. Furthermore, for increasing the stability of the resulting laminated structure to the atmospheric conditions including humidity and temperature, it is also possible to form another sealing film or a protective film on the outer surface of the plastic substrate.

Figure 12:
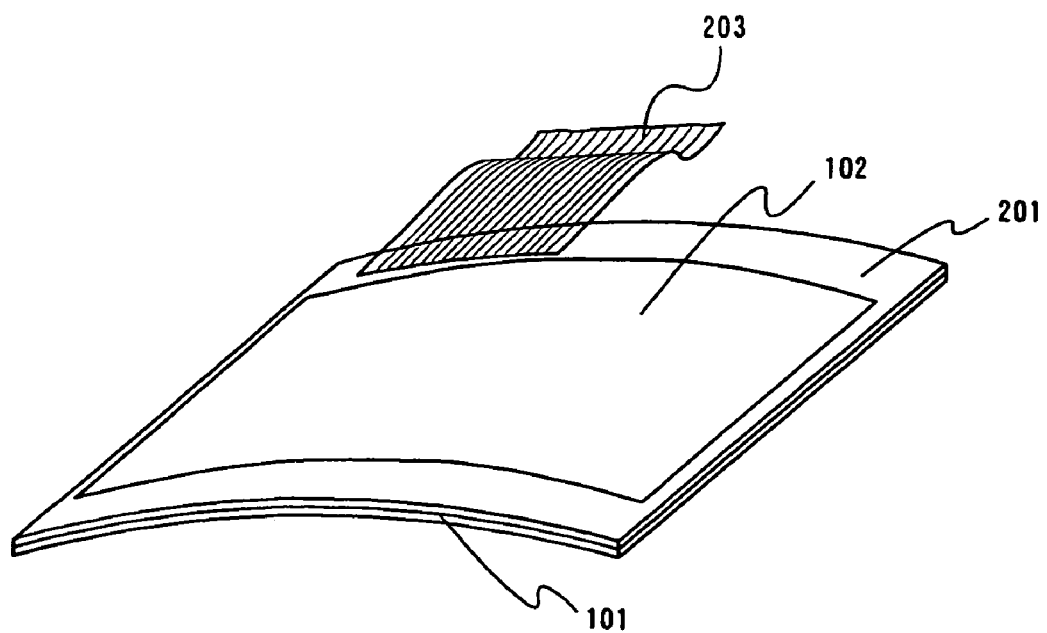
FIG. 12 is a perspective view for illustrating an exemplified configuration of the light emitting device of the present invention.

FIG. 12 is a diagram that illustrates the external configuration of a light emitting device using the plastic substrate prepared as described above. Just as with FIG. 11, a pixel portion 102, a FPC 203, and a sealing plastic substrate 201 are formed on a plastic substrate 101. For surface protection and heat dissipation, a layer represented by $Al_xN_y$ (or a layer represented by $Al_2O_3$) may be formed on one side or both sides of each of the plastic substrate 101 and the sealing plastic substrate 201. In addition, a FPC 203 forms a connection to an external circuit. Here, only the FPC 203 is illustrated in this figure, but a print wiring board (PWB) may be attached on the FPC 203. In addition, but not shown in the figure, an IC chip having a memory, a CPU, a controller, a D/A converter, and so on may be mounted by means of COG(chip on grass)method, a tape automated boding (TAB) method or a wiring-bonding method. Furthermore, the IC chip may be mounted such that it is fixed between the plastic substrate 101 and the sealing plastic substrate 201.

Consequently, a simple matrix type of light emitting device having a plastic substrate capable of preventing the substrate from deterioration with the transmission of oxygen or moisture content can be obtained. It is understood that, the present invention is not limited to the above embodiment and various kinds of modifications or changes may be allowed within the scope of the present invention.

Embodiment 2

In this embodiment, a light-emitting device is in the type of an active matrix in which a light emitting element and a TFT for controlling the light emitting element are arranged on each pixel to drive. In this embodiment, we will describe an embodiment of sealing structure for preventing the light emitting elements and TFTs from external contaminations such as oxygen and water vapor.

Figure 13:
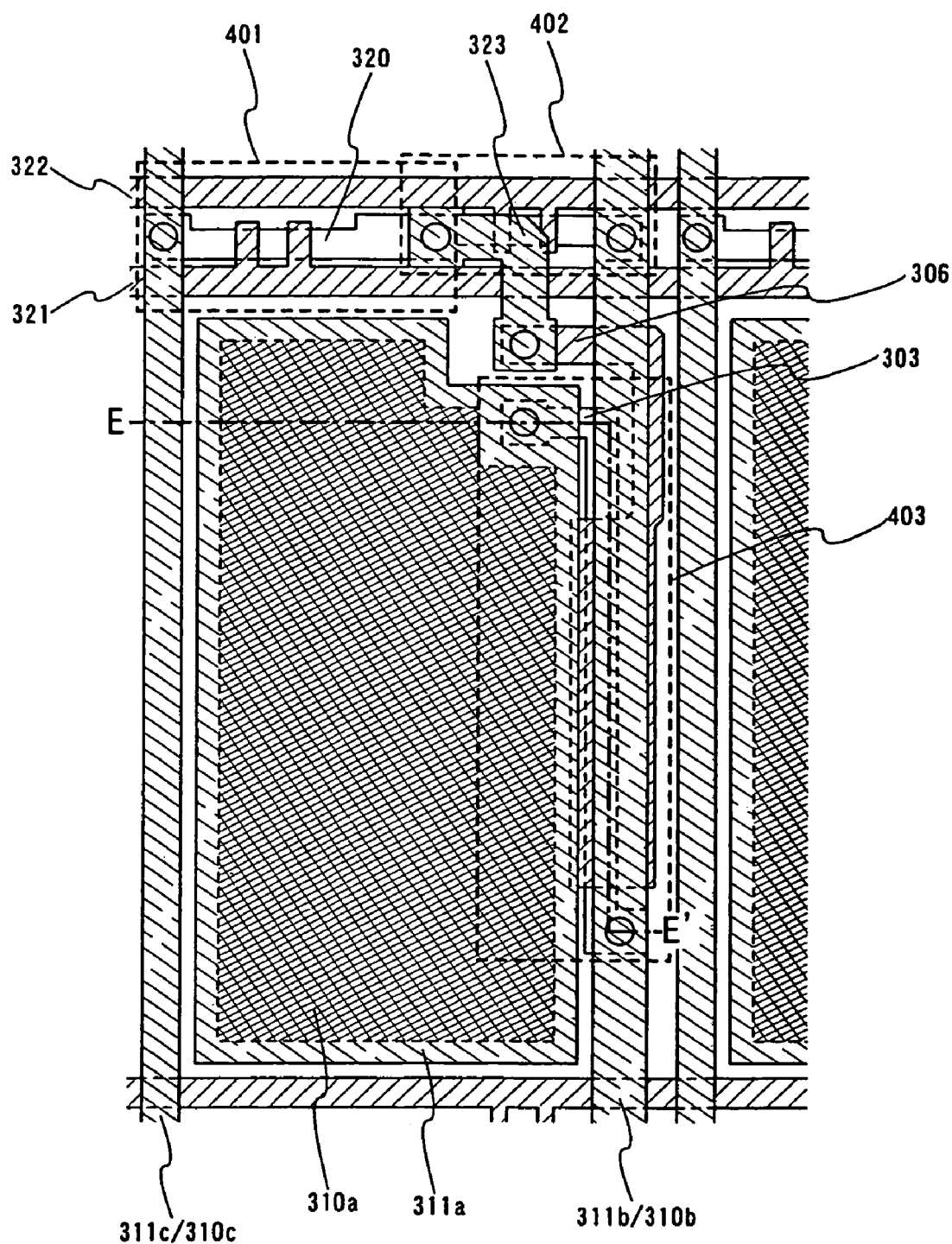
FIG. 13 is a top view for illustrating the detailed configuration of the pixel portion of the light emitting device of the present invention.
Figure 14:
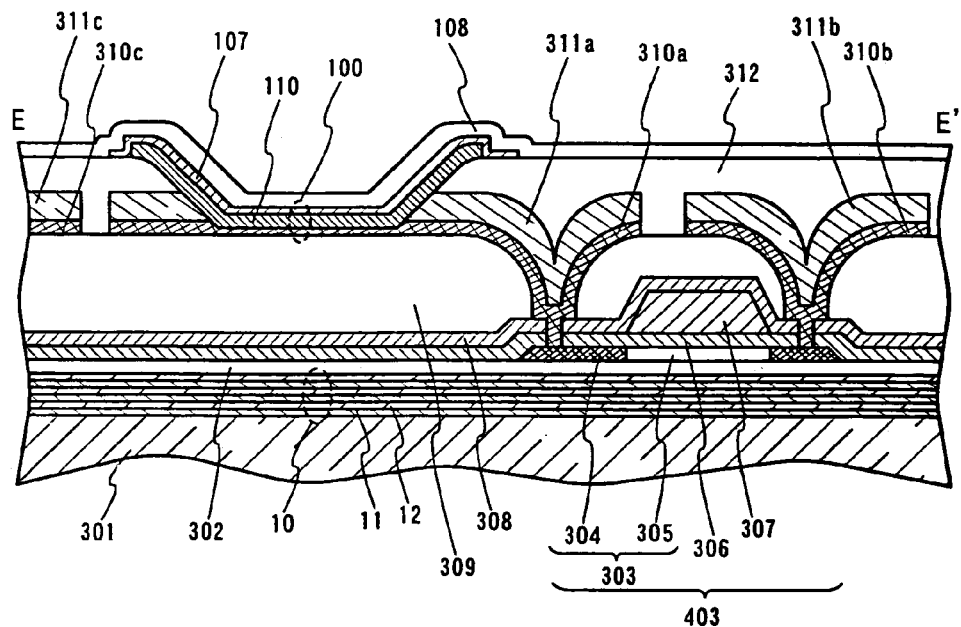
FIG. 14 is a vertical cross sectional diagram for illustrating the detailed configuration of the pixel portion of the light emitting device of the present invention.

FIG. 13 is a top view for illustrating a pixel structure of the light emitting device, showing an exemplified configuration thereof in which a TFT and a light emitting element are mounted. FIG. 14 is a vertical cross sectional view along the line E-E' in FIG. 13. Therefore, the present embodiment will be described with reference to these figures. Furthermore, in FIG. 13, the upper layers on a second electrode (i.e., a partition wall layer, an EL layer, a first electrode, and an inorganic compound layer) are omitted for a simplification of the drawing.

As shown in the figure, a lamination layer 10 comprised of a metal layer 11 and an organic compound layer 12 is formed on the principal surface of a plastic substrate 301. On the lamination layer 10, an intermediate layer 302 is formed as a combination of the respective coating films of silicon nitride, oxidized silicon nitride, silicon oxide, and so on. A preferable configuration of the intermediate layer 302 is a laminate comprised of a silicon nitride film formed by a high-frequency magnetron spattering method using silicon as a target and an oxidized silicon nitride film formed on the silicon nitride film by a plasma CVD method.

In a pixel, three TFTs are mounted. A TFT 401 is a selecting TFT for an on-off operation depending on a timing of input of an image signal into the light emitting element, a TFT 402 is an erasing TFT for terminating the emission of light from the light emitting element, and a TFT 403 is a driving TFT for driving the light emitting element. Preferably, the TFT 403 is of a p-channel type when a second electrode 310$a$ of the light emitting element 100 is provided as an anode, or of an n-channel type when it is provided as a cathode.

The configuration of the TFT is illustrated in FIG. 14. In this figure, there is shown a cross sectional view of the TFT 403 as an example. As shown in the figure, the TFT 403 comprises a semiconductor film 303 on which a source or drain region 304 and a channel-forming region 305 are formed, a gate insulating film 306, a gate electrode 307, and so on. Furthermore, a low concentration drain region may be formed on the semiconductor film 303 if required and the structure thereof is not limited.

Furthermore, a protective film 308 made of silicon nitride or oxidized silicon nitride, and a flattening film 309 made of a photosensitive organic resin material are formed on the gate electrode 307. The photosensitive organic resin material may be a polyimide resin, an acryl resin, or the like. A contact hole extending to the source or drain region 304 is formed such that an opening passing through the protective film 308 and the gate insulating film 306 are formed by a dry etching method and another opening having a diameter lager than that of the above opening is formed in the flattening film 309.

On the flattening film, a second electrode of the light emitting element and various kinds of wiring are formed by laminating a titanium nitride film 310 and an aluminum film 311. In the light-emitting element, the titanium nitride film 310$a$ forms a second electrode 310$a$ and the aluminum film 311 forms a reflector 311$a$. The second electrode 310$a$ and the reflector 311$a$ are combined with a partition layer 312 just as in the case of Embodiment 1. In addition, the titanium nitride film 310 is formed in a thickness of 50 to 100 nm, and the aluminum film 311 is formed in a thickness of 100 to 2000 nm. On such a lamination layer, it is possible to form power source line (310$b$/311$b$) and image signal line (310$c$/311$c$) in addition to the electrode of the light emitting element 100.

Furthermore, an EL layer 110, a first electrode 107, and an inorganic insulating layer 108 are configured just as in the case of Embodiment 1, so that a light emitting device in which a pixel is formed with the light emitting element 100 connected to the TFT 403. As a matter of course, the pixel structure described in this embodiment is only provided as one of preferred examples. Therefore, the pixel structure of the present invention is not limited to such a structure and another pixel structure may be applied in the present invention.

Figure 15:
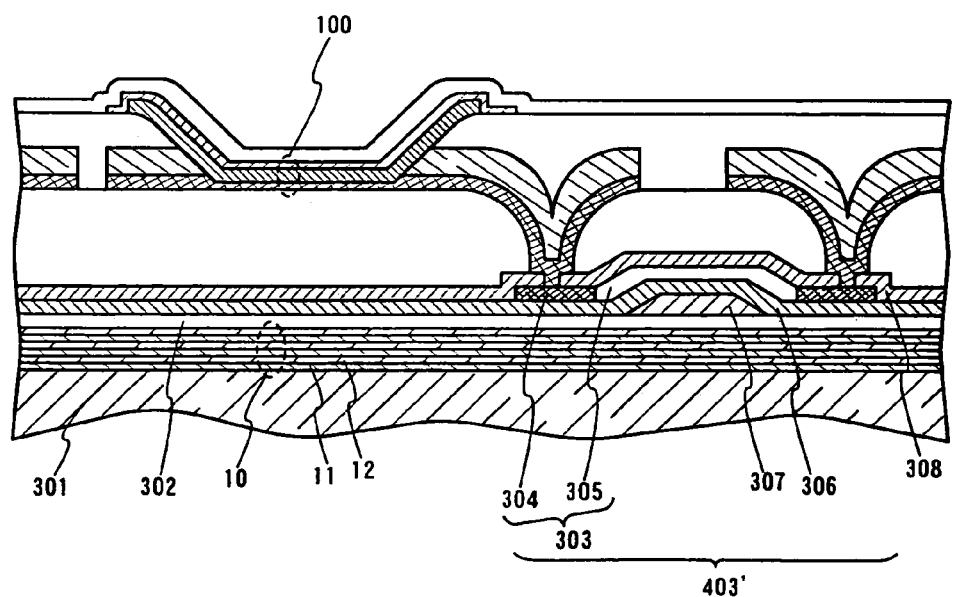
FIG. 15 is a vertical cross sectional diagram for illustrating the detailed configuration of the pixel portion of the light emitting device of the present invention.

FIG. 15 shows an example of a light emitting device in which an active matrix type of pixel structure is constructed of a reverse staggered (or bottom gate) type TFT. In this case, the TFT 403 of FIG. 14 can be directly replaced with the reverse staggered type TFT 403' without changing other structural components. On an intermediate layer 302, a gate electrode 307, a gate insulating film 306, a semiconductor film 303 containing a source or drain region 304 and a channel forming region 305, and a protecting film 308 are formed in that order. Other structural components are configured just as in the case of FIG. 14, so that the explanations thereof will be omitted.

Figure 16:
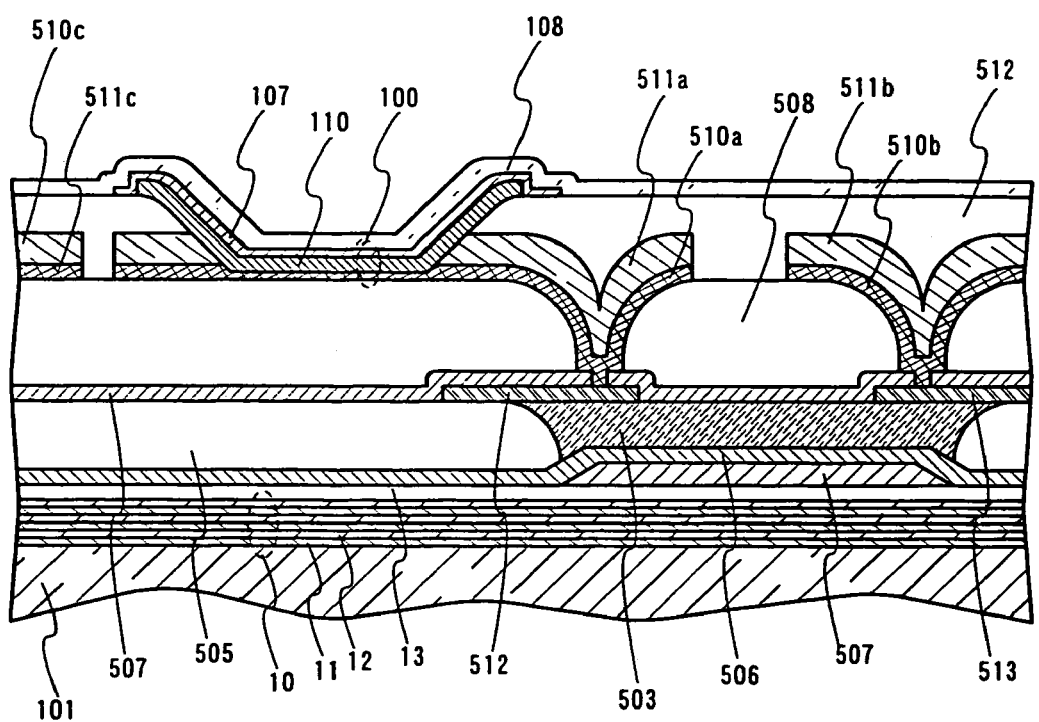
FIG. 16 is a vertical cross sectional diagram for illustrating the detailed configuration of the pixel portion of the light emitting device of the present invention.

In FIG. 16, there is shown an example in which an active matrix type of pixel is formed of an organic TFT using an organic semiconductor in a channel forming region. In addition, a lamination layer 10, an intermediate layer 502, a gate electrode 507, and a gate insulating film 506 formed on the principal surface of a plastic substrate 501 are configured just as in the case of FIG. 15.

An insulating layer 505 is used as a frame for forming an organic semiconductor in a predetermined place. An opening is formed in the insulating layer 505 corresponding to the gate electrode 507. The organic semiconductor 503 can be formed by means of a printing method, a splay method, a spin coating method, an inkjet method, or the like. The organic semiconductor material may be preferably a ŏ-electron conjugated polymer material in which the carbon skeleton thereof is constructed of a conjugated double bound. Concretely, a soluble polymer material such as polythiophene, poly(3-alkylthiophene), polythiophene derivative, or the like can be used. Other applicable organic semiconductor materials may be those capable of forming an organic semiconductor layer by means of an appropriate process after the film formation from a soluble precursor. Furthermore, the organic semiconductor materials to be provided via precursors thereof include polythienylene vinylene, poly(2,5-thienylene vinylene), polyacetylene, polyacetylene derivative, polyallylene vinylene, and so on. At the time of converting the precursor into the organic semiconductor, not only subjecting to a heating treatment, a reaction catalyst such as hydrogen chloride gas is added. In addition, typical solvents useful for dissolving the soluble organic semiconductor material include toluene, xylene, chlorobenzene, dichlorobenzen, anisole, chloroform, dichloromethane, â-butyl lactone, butyl cellsolve, cyclohexane, NMP(N-metyl-2-pyrrolidone), cyclobexanone, 2-butanone, dioxane, dimethylfolmamide (DMF), or tetrahydrofuran(THF), and so on.

Souse or drain electrodes 512, 513 are contact with the organic semiconductor 503 and function as source or drain in the organic TFT. The material that forms these wiring members is preferably a metal having a large work function for making ohmic contact with the semiconductor layer because many organic semiconductor materials that transport holes as carriers are p-type semiconductors.

After the formation of a protective film 517 and a flattening film 508, a second electrode formed of a titanium nitride 510$a$, a reflector formed of aluminum 511$a$, wiring 510$b$/511$b$, wiring 510$c$/511$c$, a partition layer 512, an EL layer 110, a first electrode 107, a light-emitting element 100, and an inorganic insulating layer 108 are configured just as in the case of FIG. 14.

A terminal for the input of signals can be configured by the same way as that of Embodiment 1. In other words, a sealing structure provided such that an inorganic compound layer covers the end surface of a lamination layer can be realized by a light-emitting device having an active matrix type pixel.

In the above description, the configurations of the light emitting devices having the active matrix type of pixels using the top gate type or bottom gate type TFT with the inorganic semiconductor and the organic TFT with the organic semiconductor have been explained. In each of these cases, it can be used as a plastic substrate capable of preventing the transmission of oxygen or moisture content. Furthermore, the present invention is not limited to the above embodiment and various kinds of modifications or changes may be allowed within the scope of the present invention.

Embodiment 3

Various kinds of electronic apparatus can be implemented with the light emitting device of the present invention described above. Typical electronic apparatus includes personal digital assistants (i.e., electronic notes, mobile computers, cellular phones, and electronic books and magazines), video cameras, digital cameras, cellular phones, and so on. Some of these examples are shown in FIG. 20.

Figure 20A:
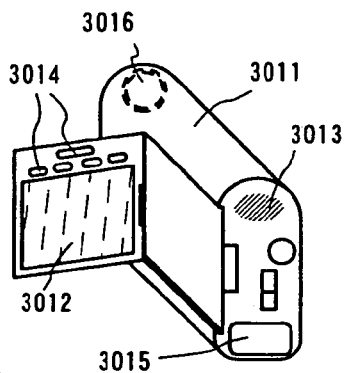
FIGS. 20A-20E are diagrams that illustrates the applications of the light-emitting device.

In FIG. 20A, there is shown an example of a video camera implemented by the application of the present invention. The video camera comprises a main body 3011, a display part 3012, a voice input part 3013, an operation switch 3014, a battery unit 3015, and a viewing part 3016. Accordingly, the present invention allows the implementation of such a light-weighted video camera.

Figure 20B:
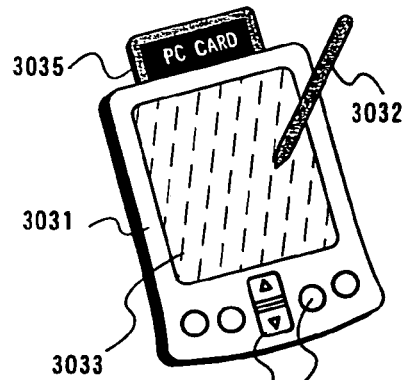

In FIG. 20B, there is shown an example of a personal digital assistant (PDA) implemented by the application of the present invention. The PDA comprises a main body 3031, a stylus pen 3032, a display part 3033, an operation button 3034, an external interface 3035, and so on. The present invention allows the PDA to be thinned and light-weighted and implements a weather-proof PDA.

Figure 20C:
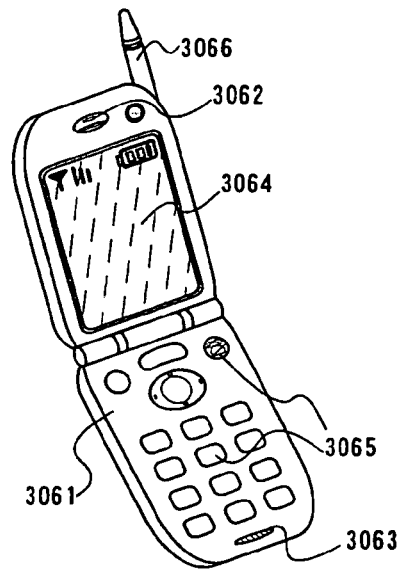

In FIG. 20C, there is shown an example of a cellular phone implemented by the application of the present invention. The cellular phone comprises a main body 3061, a voice output part 3062, a voice input part 3063, a display part 3064, an operation switch 3065, an antenna 3066, and so on. The present invention allows the cellular phone to be thinned and light-weighted and implements a weather-proof cellular phone.

Figure 20D:
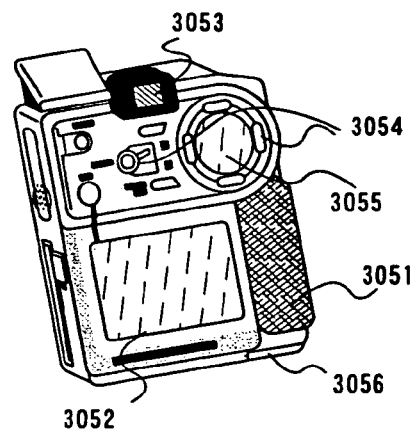

In FIG. 20D, there is shown an example of a digital camera implemented by the application of the present invention. The digital camera comprises a main body 3051, a display part (A) 3052, an ocular part 3053, an operation switch 3054, a display part (B) 3055, a battery unit 3056, and so on. The present invention allows the digital camera to be thinned and light-weighted and implements a weather-proof digital camera.

Figure 20E:
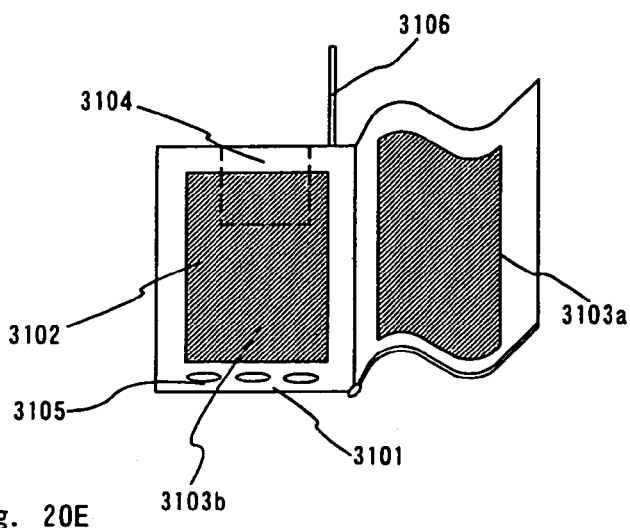

In FIG. 20E, there is shown an example of a digital book or magazine implemented by the application of the present invention. The digital book (magazine) comprises a main body 3101, a display part (A) 3102, a display part (B) 3103, a recording medium 3104, an operation system 3105, an antenna 3106, and so on. The present invention allows the digital book to be thinned and light-weighted and implements a weather-proof digital book magazine.

Furthermore, these digital apparatus are a small part of the applications of the present invention, so that the present invention cannot be restricted by the electronic apparatus described above.

According to the present invention, therefore, a lamination layer constructed of a metal layer and an organic compound layer can be formed on a plastic substrate, so that a light emitting device having a simple matrix or active matrix type of pixel structure that prevents the substrate from deterioration with the transmission of oxygen or moisture content can be obtained.

What is claimed is:

1. A light emitting device comprising:
   a substrate;
   a lamination layer formed over the substrate, the lamination layer comprising a metal layer and an organic compound layer;
   a partition wall layer formed over the lamination layer;
   an intermediate layer formed over the lamination layer; and
   a light emitting element formed over the lamination layer,
   wherein the light emitting element comprises a first wiring, a second wiring crossed the first wiring, and a light emitting layer formed between the first wiring and second wiring, and
   wherein the first wiring comprises a first portion overlapped the partition wall layer and a second portion,
   wherein the first portion comprises a laminate of a reflector and a conductive material, and
   wherein the second portion comprises the conductive material layer.

2. A light emitting device according to claim 1, wherein the first wiring has an angle θ of a reflection surface of the reflector which is in the range of 30° to 75° with respect to a principal surface of the substrate.

3. A light emitting device according to claim 1, wherein the metal layer is formed of aluminum or aluminum alloy.

4. A light emitting device according to claim 1, wherein the substrate is one selected from the group consisting of polyether sulphone, polyallylate, polyimide, polyamide, acrylic resin, epoxy resin, polyethylene terephthalate, polyethylenenaphthalate and polycarbonate.

5. A light emitting device according to claim 1, wherein the metal layer has a thickness of 10 to 100 nm.

6. A light emitting device according to claim 1, wherein the partition wall layer is formed between the reflector and the second wiring.

7. A light emitting device comprising:
   a substrate;
   a lamination layer formed over the substrate, the lamination layer comprising a metal layer and an organic compound layer;
   a partition wall layer formed over the lamination layer;
   an intermediate layer formed over the lamination layer;
   a light emitting element formed over the lamination layer; and
   a signal input terminal formed over the lamination layer,
   wherein the light emitting element comprises a first wiring, a second wiring crossed the first wiring, and a light emitting layer formed between the first wiring and second wiring,
   wherein the first wiring comprises a first portion overlapped the partition wall layer and a second portion,
   wherein the first portion comprises a laminate of a reflector and a conductive material,
   wherein the second portion comprises the conductive material layer,
   wherein the signal input terminal is formed of the same material as that of the first wiring, and
   wherein the signal input terminal is electrically connected to an end portion of the second wiring.

8. A light emitting device according to claim 7, wherein the first wiring has an angle θ of a reflection surface of the reflector which is in the range of 30° to 75° with respect to a principal surface of the substrate.

9. A light emitting device according to claim 7, wherein the metal layer is formed of aluminum or aluminum alloy.

10. A light emitting device according to claim 7, wherein the substrate is one selected from the group consisting of polyether sulphone, polyallylate, polyimide, polyamide, acrylic resin, epoxy resin, polyethylene terephthalate, polyethylenenaphthalate and polycarbonate.

11. A light emitting device according to claim 7, wherein the metal layer has a thickness of 10 to 100 nm.

12. A light emitting device according to claim 7, wherein the partition wall layer is formed between the reflector and the second wiring.

13. A light emitting device comprising:
   a first substrate;
   a lamination layer formed over the substrate, the lamination layer comprising a metal layer and an organic compound layer;

a partition wall layer formed over the lamination layer;
an intermediate layer formed over the lamination layer;
a light emitting element formed over the lamination layer;
a resin material formed over the light emitting element; and
a second substrate fixed on the first substrate,
wherein the light emitting element comprises a first wiring, a second wiring crossed the first wiring, and a light emitting layer formed between the first wiring and second wiring, and
wherein the first wiring comprises a first portion overlapped the partition wall layer and a second portion,
wherein the first portion comprises a laminate of a reflector and a conductive material, and
wherein the second portion comprises the conductive material layer.

14. A light emitting device according to claim 13, wherein the first wiring has an angle θ of a reflection surface of the reflector which is in the range of 30° to 75° with respect to a principal surface of the first substrate.

15. A light emitting device according to claim 13, wherein the metal layer is formed of aluminum or aluminum alloy.

16. A light emitting device according to claim 13, wherein the first substrate is one selected from the group consisting of polyether sulphone, polyallylate, polyimide, polyamide, acrylic resin, epoxy resin, polyethylene terephthalate, polyethylenenaphthalate and polycarbonate.

17. A light emitting device according to claim 13, wherein the metal layer has a thickness of 10 to 100 nm.

18. A light emitting device according to claim 13, wherein the partition wall layer is formed between the reflector and the second wiring.

* * * * *